United States Patent
Yajima

(10) Patent No.: US 12,308,745 B2
(45) Date of Patent: May 20, 2025

(54) SWITCHING CIRCUIT AND POWER SUPPLY CIRCUIT

(71) Applicant: JAPAN SCIENCE AND TECHNOLOGY AGENCY, Kawaguchi (JP)

(72) Inventor: Takeaki Yajima, Fukuoka (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 92 days.

(21) Appl. No.: 18/370,513

(22) Filed: Sep. 20, 2023

(65) Prior Publication Data

US 2024/0014815 A1    Jan. 11, 2024

Related U.S. Application Data

(63) Continuation of application No. PCT/JP2022/014036, filed on Mar. 24, 2022.

(30) Foreign Application Priority Data

Mar. 30, 2021 (JP) ................. 2021-057530

(51) Int. Cl.
   *H02M 3/158* (2006.01)
   *H02M 1/08* (2006.01)
   (Continued)

(52) U.S. Cl.
   CPC ........... *H02M 3/1582* (2013.01); *H02M 1/08* (2013.01); *H02M 3/155* (2013.01); *H02M 7/04* (2013.01);
   (Continued)

(58) Field of Classification Search
   CPC .................................................. H02M 3/1582
   See application file for complete search history.

(56) References Cited

U.S. PATENT DOCUMENTS

2017/0279297 A1    9/2017  Gao et al.
2018/0183256 A1    6/2018  Tanaka et al.
(Continued)

FOREIGN PATENT DOCUMENTS

JP    2014-33494 A    2/2014
JP    2015-171266 A   9/2015
(Continued)

OTHER PUBLICATIONS

International Search Report dated Jun. 21, 2022, issued in counterpart International Application No. PCT/JP2022/014036, with English Translation. (5 pages).
(Continued)

*Primary Examiner* — Patrick O Neill
(74) *Attorney, Agent, or Firm* — WHDA, LLP

(57) ABSTRACT

A switching circuit includes a first switching element that has a first control terminal, a connection state between a power generation element and an electric storage device being controlled in accordance with a voltage applied to the first control terminal, and a control circuit configured to output a first voltage to the first control terminal until a voltage difference between both ends of the electric storage device becomes a first predetermined value larger than an initial state when the voltage difference increases from the initial state with time, and output a second voltage to the first control terminal until the voltage difference becomes lower than a second predetermined value smaller than the first predetermined value when the voltage difference exceeds the first predetermined value, the first voltage being a voltage that keeps the first switching element on, the second voltage being a voltage that keeps the first switching element off.

19 Claims, 18 Drawing Sheets

(51) Int. Cl.
    *H02M 3/155*     (2006.01)
    *H02M 7/04*     (2006.01)
    *H03K 3/353*     (2006.01)
    *H03K 17/06*     (2006.01)
    *H03K 17/687*     (2006.01)

(52) U.S. Cl.
    CPC ........... *H03K 3/353* (2013.01); *H03K 17/063* (2013.01); *H03K 17/687* (2013.01)

(56) References Cited

U.S. PATENT DOCUMENTS

2020/0321948 A1    10/2020  Bose et al.
2022/0014179 A1    1/2022  Yajima

FOREIGN PATENT DOCUMENTS

| JP | 2017-184304 A | 10/2017 |
| JP | 2018-107963 A | 7/2018 |
| JP | 2021-15323 A | 2/2021 |
| WO | 2020/175209 A1 | 9/2020 |

OTHER PUBLICATIONS

Written Opinion of the International Searching Authority (Form PCT/ISA/237) dated Jun. 21, 2022, issued in counterpart International Application No. PCT/JP2022/014036. (4 pages).

SWITCHING CIRCUIT AND POWER SUPPLY CIRCUIT

CROSS-REFERENCE TO RELATED APPLICATION

This application is based upon and claims the benefit of priority of the prior International Patent Application No. PCT/JP2022/014036, filed on Mar. 24, 2022, which claims the benefits of priority of Japanese Patent Application No. 2021-057530 filed on Mar. 30, 2021, the entire contents of which are incorporated herein by reference.

FIELD

The present disclosure relates to a switching circuit and a power supply circuit.

BACKGROUND

In order to use the power generated by a vibration power generation element itself as the power to operate the control circuit in the power conversion circuit that converts the power generated by the vibration power generation element, it is known to store the power generated by the vibration power generation element or other power generation elements in an electric storage device such as a capacitor and supply the stored power to the control circuit. In this case, a cold start switch having a function of directly connecting the output of the power generation element and the electric storage device is provided, and the control of the circuit is started using the power stored in the electric storage device. Thereafter, when the voltage from the power generation element becomes high, the connection between the output of the power generation element and the electric storage device is disconnected to reduce the power consumption in the cold start switch as disclosed in FIG. 5 of Japanese Patent Application Laid-Open No. 2014-33494 (Patent Document 1).

SUMMARY

It is desirable for the cold start switch to be able to supply the required power as stably as possible. However, in the case that a change in output is large as in the vibration power generation element, it is difficult to turn on and off the cold start switch at an appropriate timing. In this case, the utilization efficiency of the electric power generated from the power generation element is reduced.

The present invention has been made in view of the above problems, and an object thereof is to provide a switching circuit and a power supply circuit that can control ON/OFF of the cold start switch at an appropriate timing and has improved utilization efficiency of electric power generated from the power generation element.

In one aspect of the present disclosure, there is provided a switching circuit including: a first switching element that controls a connection state between a power generation element and an electric storage device in accordance with a voltage applied to a first control terminal; and a control circuit configured to output a first voltage to the first control terminal until a voltage difference between both ends of the electric storage device becomes a first predetermined value larger than an initial state when the voltage difference increases from the initial state with time, and output a second voltage to the first control terminal until the voltage difference becomes lower than a second predetermined value smaller than the first predetermined value when the voltage difference exceeds the first predetermined value, the first voltage being a voltage that keeps the first switching element on, the second voltage being a voltage that keeps the first switching element off.

In the above configuration, a configuration in which the power generation element includes: a power generation unit configured to output an alternating current; and a rectifier circuit configured to rectify the alternating current may be employed.

In the above configuration, a configuration in which the electric storage device has one end connected to a reference potential, and another end of which a connection state with the power generation element is controlled by the first switching element, and the first switching element is an enhancement type FET, and the control circuit outputs a voltage of a terminal, which is at a side of the power generation element, of the first switching element as the first voltage, and outputs the reference potential as the second voltage may be employed.

In the above configuration, a configuration in which the rectifier circuit generates a positive voltage with respect to the reference potential, and the first switching element is an enhancement type NFET may be employed.

In the above configuration, a configuration in which the rectifier circuit generates a negative voltage with respect to the reference potential, and the first switching element is an enhancement type PFET may be employed.

In the above configuration, a configuration in which the electric storage device has one end connected to a reference potential, and another end of which a connection state with the power generation element is controlled by the first switching element, and the first switching element is an enhancement type FET, and the control circuit outputs the reference potential as the first voltage, and outputs a voltage of a terminal, which is at a side of the power generation element, of the first switching element as the second voltage may be employed.

In the above configuration, a configuration in which the rectifier circuit generates a positive voltage with respect to the reference potential, and the first switching element is an enhancement type PFET may be employed.

In the above configuration, a configuration in which the rectifier circuit generates a negative voltage with respect to the reference potential, and the first switching element is an enhancement type NFET may be employed.

In the above configuration, a configuration in which a second switching element that is an enhancement type FET and controls a connection state between the first switching element and the electric storage device in accordance with a voltage applied to a second control terminal is further provided, and the control circuit outputs the reference potential to the second control terminal until the voltage difference between both ends of the electric storage device becomes the first predetermined value when the voltage difference increases with time from the initial state, and outputs a voltage of a terminal, which is at a side of the electric storage device, of the second switching element to the second control terminal until the voltage difference becomes lower than the second predetermined value when the voltage difference exceeds the first predetermined value may be employed.

In the above configuration, a configuration in which a third switching element that controls a connection state between the first control terminal and a reference potential in accordance with a voltage applied to a third control terminal, wherein the electric storage device has one end connected to the reference potential, and another end of which a connection state with the power generation element is controlled by the first switching element is further provided, the first control terminal is capacitively coupled to the power generation element, the first switching element is an enhancement type FET, and the control circuit continues to output the reference potential to the third control terminal until the voltage difference reaches the first predetermined value, and outputs the voltage of said another end of the electric storage device to the third control terminal until the voltage difference becomes lower than the second predetermined value when the voltage difference exceeds the first predetermined value may be provided.

In the above configuration, a configuration in which a fourth switching element having a withstand voltage lower than that of the first switching element, the fourth switching element controlling a connection state between the first switching element and the electric storage device in accordance with the voltage applied to the first control terminal; and a limiting element configured to limit a voltage between the first switching element and the fourth switching element so as not to exceed a third predetermined value are further provided may be employed.

In the above configuration, a configuration in which the control circuit includes a latch circuit configured to output the first voltage to the first control terminal until the voltage difference between both ends of the electric storage device becomes the first predetermined value when the voltage difference increases with time from the initial state, and output the second voltage to the first control terminal until the voltage difference becomes lower than the second predetermined value when the voltage difference exceeds the first predetermined value may be employed.

In the above configuration, a configuration in which the control circuit is a control circuit that resets a latch state of the latch circuit to output the first voltage that turns on the first switching element to a control terminal of the first switching element when the voltage difference becomes lower than the second predetermined value may be employed.

In the above configuration, a configuration in which in the initial state, the voltage difference between both ends of the electric storage device is 0 V may be employed.

In another aspect of the present disclosure, there is provided a power supply circuit including: the above switching circuit; and a power conversion circuit configured to convert output power of the power generation element, wherein the switching circuit outputs a signal for activating the power conversion circuit to the power conversion circuit when the voltage difference exceeds the first predetermined value.

In the above configuration, a configuration in which when the voltage difference exceeds the first predetermined value, the switching circuit remains off until the voltage difference becomes lower than the second predetermined value may be employed.

In the above configuration, a configuration in which when the voltage difference exceeds the first predetermined value, the switching circuit is turned off and outputs a signal for activating the power conversion circuit to the power conversion circuit may be employed.

In the above configuration, a configuration in which the power conversion circuit is a voltage conversion circuit that includes an inductor and converts a third voltage input from the power generation element into a fourth voltage may be employed.

In the above configuration, a configuration in which the switching circuit includes: a determination circuit configured to determine whether the voltage difference exceeds the first predetermined value; and a generation circuit configured to generate the signal for activating the power conversion circuit when the determination circuit determines that the voltage difference exceeds the first predetermined value may be employed.

DETAILED DESCRIPTION

Hereinafter, embodiments will be described with reference to the drawings.

First Embodiment

Figure 1:
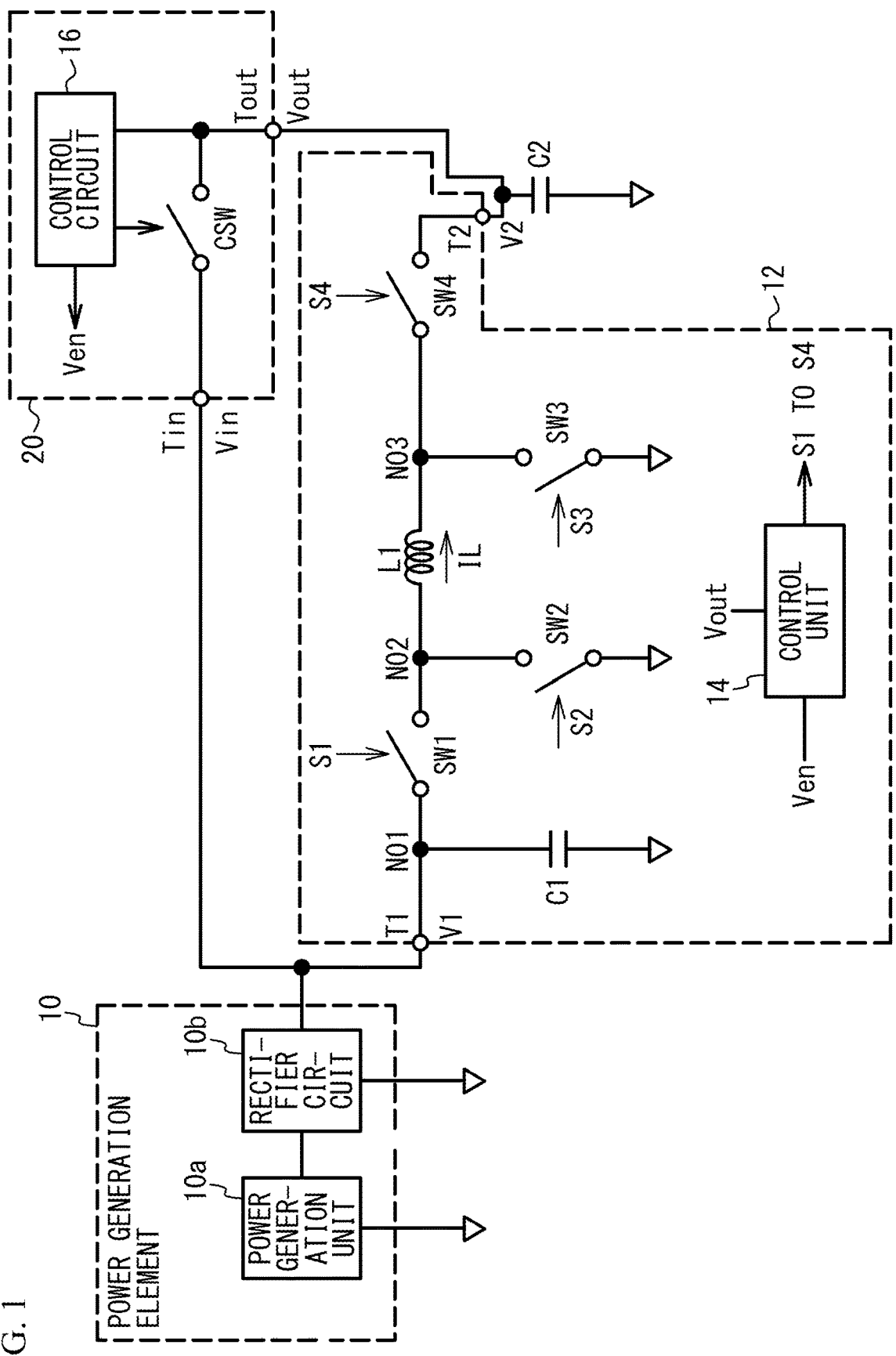
FIG. 1 is a circuit diagram illustrating a power supply circuit in which a switching circuit in accordance with an embodiment is used.

FIG. 1 is a circuit diagram illustrating a power supply circuit in which a switching circuit in accordance with an embodiment is used. As illustrated in FIG. 1, the power supply circuit includes a voltage conversion circuit 12 and a switching circuit 20. The switching circuit 20 includes a cold start switch CSW and a control circuit 16. The cold start switch CSW is a switch that turns on and off to connect and disconnect between an input terminal Tin and an output terminal Tout. The control circuit 16 controls ON/OFF of the cold start switch CSW. Further, the control circuit 16 outputs an enable signal Ven that activates the voltage conversion circuit 12 to the voltage conversion circuit 12. The output of a power generation element 10 is input to the input terminal Tin of the switching circuit 20 and an input terminal T1 of the voltage conversion circuit 12. The power generation element 10 is composed of a combination of a power generation unit 10a, which is an energy harvesting element such as a vibration power generation element, and a rectifier circuit 10b. When the power generation unit (power generation portion) 10a outputs an alternating current, the alternating current output by the power generation unit 10a is rectified by the rectifier circuit 10b and input to the input terminal Tin.

The vibration power generation element is, for example, a piezoelectric element using a piezoelectric material or a micro electro mechanical systems (MEMS) element using MEMS. The vibration power generation element is provided on a road, a bridge, or the like, for example, and generates power by vibration caused by pedestrians or vehicles passing by. The generated power of the power generation element 10 is micro power and varies with time. The first embodiment is an example of a case where the power generation element 10 includes the rectifier circuit 10b in which the output as the power generation element 10 is positive with respect to the ground. In this case, a voltage V2 of a capacitor C2 is positive. As described above, the power generation element 10 is an element that generates a voltage having one polarity with respect to the ground (reference potential).

The output terminal Tout of the switching circuit 20 is connected to one end of the capacitor C2. The capacitor C2 is an electric storage device. An output terminal T2 of the voltage conversion circuit 12 is connected to the one end of the capacitor C2. A voltage Vout at the output terminal Tout of the switching circuit 20 and the voltage V2 at the output terminal T2 of the voltage conversion circuit 12 are both voltages of the capacitor C2 with respect to the ground. In the following description, the voltage V2 is used as the voltage of the capacitor C2 when describing the operation of the voltage conversion circuit 12, but the voltage Vout is used as the voltage of the capacitor C2 in the other description.

The voltage conversion circuit 12 converts a voltage V1 at the input terminal T1 into the voltage V2 of the capacitor C2 and outputs it to the output terminal T2. A value obtained by dividing the voltage V1 by the current input to the input terminal T1 corresponds to the input impedance of the voltage conversion circuit 12. The value of each element of the voltage conversion circuit 12 is set in advance so that the input impedance of the voltage conversion circuit 12 and the output impedance of the power generation element 10 match. Each unit including a control unit 14 in the voltage conversion circuit 12 operates using the power stored in the capacitor C2 from the power generation element 10.

Nodes N01 to N03 are provided between the input terminal T1 and the output terminal T2 of the voltage conversion circuit 12. One end of a switch SW1 is connected to the node N01, and the other end thereof is connected to the node N02. One end of an inductor L1 is connected to the node N02, and the other end thereof is connected to the node N03. One end of a switch SW4 is connected to the node N03, and the other end thereof is connected to the output terminal T2. One end of a primary-side capacitor C1 is connected to the node N01, and the other end thereof is connected to a ground (reference potential). One end of a switch SW2 is connected to the node N02, and the other end thereof is connected to a ground. One end of a switch SW3 is connected to the node N03, and the other end thereof is connected to a ground. One end of the secondary-side capacitor C2 is connected to the output terminal T2, and the other end thereof is connected to a ground. The switches SW1 to SW4 are turned on or off based on control signals S1 to S4, respectively. The enable signal Ven and the voltage Vout are input to the control unit 14 of the voltage conversion circuit 12, and the control unit 14 outputs the control signals S1 to S4. The control unit 14 and the control circuit 16 may be, for example, a dedicated circuit or a processor.

Figure 2:
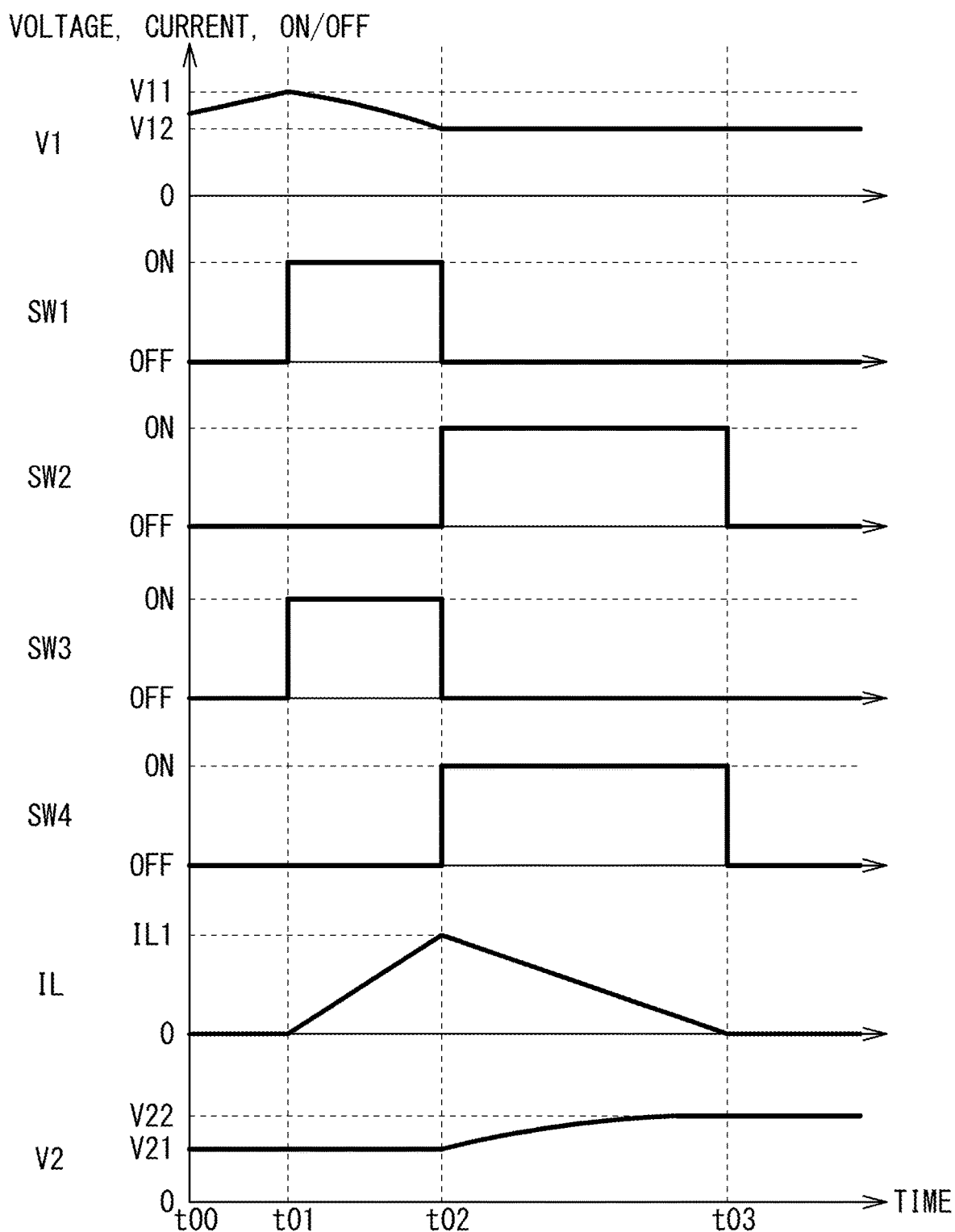
FIG. 2 is a diagram illustrating ON and OFF of switches and a current IL flowing through an inductor with respect to time in a voltage conversion circuit in which the switching circuit in accordance with the embodiment is used.

FIG. 2 is a diagram illustrating ON and OFF of switches and a current IL flowing through an inductor with respect to time in a voltage conversion circuit in which the switching circuit according to the embodiment is used.

Before the power generation element 10 starts power generation, the voltage Vout of the capacitor C2 is low, for example, 0 V. When the voltage Vout is low, the cold start switch CSW is turned on to connect the output of the power generation element 10 to the capacitor C2 without passing through the voltage conversion circuit 12. Since power for allowing the voltage conversion circuit 12 to substantially operate is not supplied to the voltage conversion circuit 12, the voltage conversion circuit 12 does not operate. For example, the control signals S1 to S4 are 0 V, and at this time, the switches SW1 to SW4 are off. When the voltage Vout of the capacitor C2 becomes large enough to allow the voltage conversion circuit 12 to operate, the control circuit 16 turns off the cold start switch CSW and outputs the enable signal Ven to the voltage conversion circuit 12. As a result, the voltage conversion circuit 12 is activated and starts operating. The control unit 14 of the voltage conversion circuit 12 starts to control the switches SW1 to SW4.

At time t00, the value of the voltage V2 is V21. The control unit 14 maintains the switches SW1 to SW4 in the OFF state. The electric charge stored in the capacitor C1 is increased by the generated current of the power generation element 10, and the voltage V1 is gradually increased. When the value of the voltage V1 exceeds a threshold voltage V11, the control unit 14 turns on the switches SW1 and SW3 and maintains the OFF states of the switches SW2 and SW4 at time t01. As a result, the current IL starts to flow from the capacitor C1 to the ground via the node N01, the switch SW1, the inductor L1, and the switch SW3. Between time t01 and time t02, the current IL gradually increases and the charge of the capacitor C1 is released, and thereby, the voltage V1 gradually decreases. Magnetic field energy is stored in the inductor L1.

At time t02, the value of the voltage V1 becomes V12. The value of the voltage V2 is V21. The current IL is maximum at IL1. The control unit 14 turns off the switches SW1 and SW3 and turns on the switches SW2 and SW4. Between time t02 and time t03, the magnetic field energy stored in the inductor L1 causes the current IL to flow from the ground through the switch SW2, the inductor L1, and the switch SW4, and the capacitor C2 is charged. The voltage V2 rises.

At time t03, the control unit 14 turns off the switches SW2 and SW4 and maintains the OFF states of the switches SW1 and SW3. After time t03, the current IL is 0, the value of the voltage V1 is V12, and the value of the voltage V2 is V22. The voltage values V21 and V22 may be lower or higher than the voltage values V11 and V12. As described above, when a current is input from the power generation element 10 to the input terminal T1 while the switches SW1 to SW4 are off, the capacitor C1 is charged. When the voltage at the node N01 side of the capacitor C1 with respect to the ground, i.e., the value of the voltage V1 at the input terminal T1, reaches the threshold voltage V11, and the voltage conversion circuit 12 operates, the charge of the capacitor C1 moves to the capacitor C2. The voltage at the output terminal T2 side of the capacitor C2 with respect to the ground is the voltage V2 at the output terminal T2.

Figure 3A:
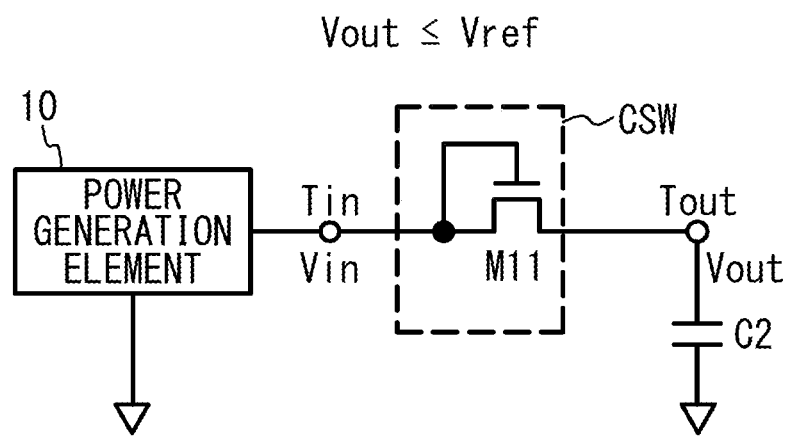
FIG. 3A and FIG. 3B are circuit diagrams of a switching circuit in accordance with a first embodiment.
Figure 3B:
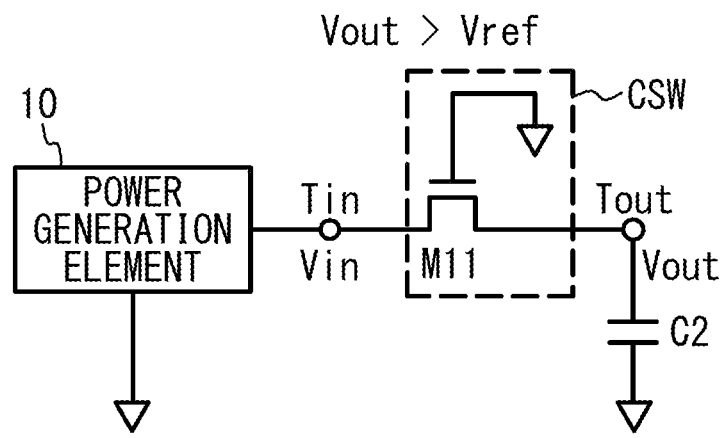

FIG. 3A and FIG. 3B are circuit diagrams of the switching circuit in accordance with the first embodiment. As illustrated in FIG. 3A, in the first embodiment, an NFET M11 of an enhancement mode (normally-off mode) is used as the cold start switch CSW. The threshold voltage of the NFET M11 is positive. The source of the NFET M11 is connected to the output terminal Tout and the drain is connected to the input terminal Tin. The terminal connected to the output terminal Tout among the source and the drain is a first terminal, and the terminal connected to the input terminal Tin is a second terminal. The gate is a control terminal. The cold start switch CSW is controlled to be turned on when the voltage Vout is equal to or lower than a predetermined reference voltage Vref and to be turned off when the voltage Vout is higher than the reference voltage Vref. Therefore, when the voltage Vout is equal to or lower than the reference voltage Vref, the gate of the NFET M11 is connected to the drain without power supply. Thus, the NFET M11 is turned on when the voltage Vin with respect to the voltage Vout becomes equal to or higher than the threshold voltage of the NFET M11. As illustrated in FIG. 3B, when the voltage Vout is higher than the reference voltage Vref, the ground potential is applied to the gate of the NFET M11. Thus, the NFET M11 is turned off.

As described above, when the voltage Vout of the capacitor C2 is lower than the reference voltage Vref, the cold start switch CSW is not controlled by the control circuit and is turned on with no power supply. When the voltage Vout is higher than the reference voltage Vref, the cold start switch CSW is turned off.

Figure 4:
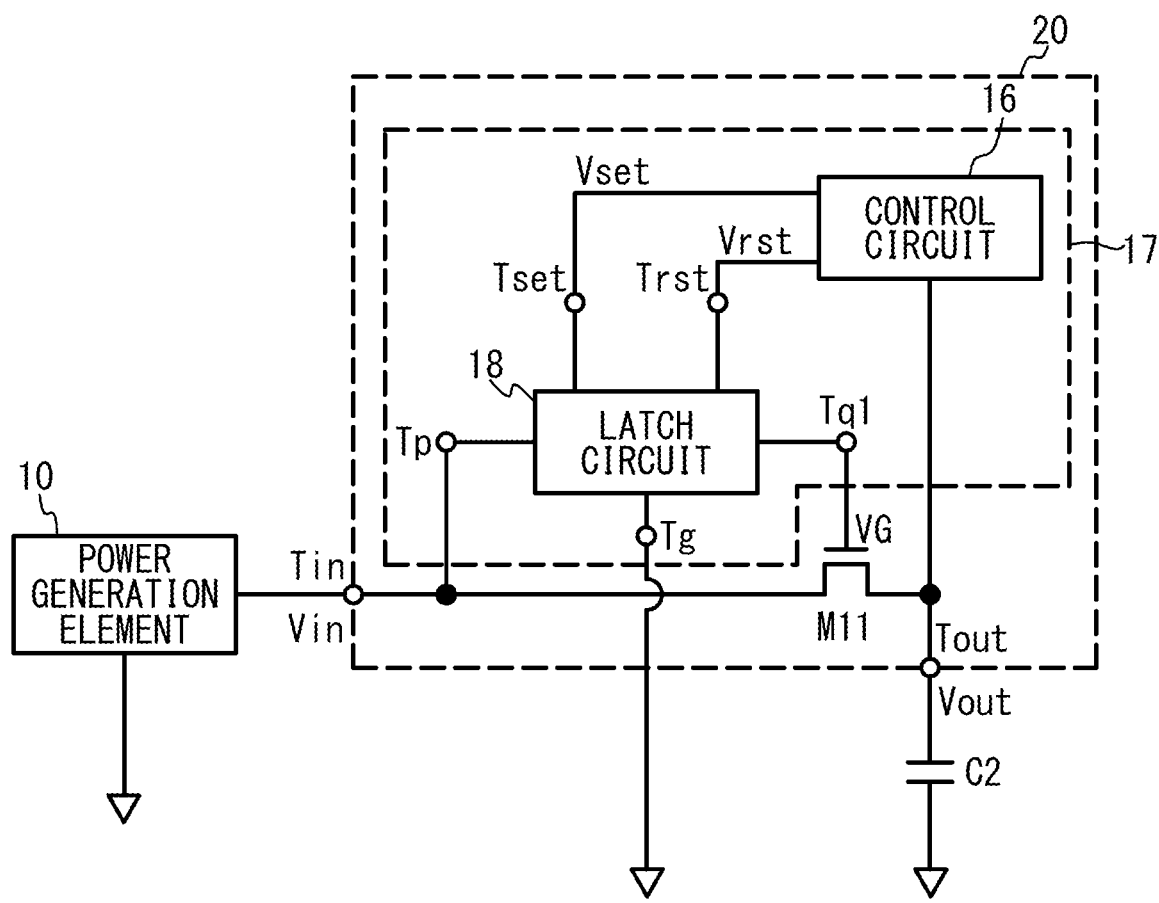
FIG. 4 is a circuit diagram of the switching circuit in accordance with the first embodiment.

FIG. 4 is a circuit diagram of a switching circuit in accordance with a first embodiment. As illustrated in FIG. 4, the switching circuit 20 includes the NFET M11 and a circuit 17. The circuit 17 is a circuit that applies a voltage VG to the gate so that the NFET M11 is turned on when the voltage Vout is equal to or lower than the reference voltage Vref as illustrated in FIG. 3A, and applies the voltage VG to the gate so that the NFET M11 is turned off when the voltage Vout is higher than the reference voltage Vref as illustrated in FIG. 3B.

The NFET M11 is of an enhancement mode, the source is connected to the output terminal Tout, and the drain is connected to the input terminal Tin. A power supply terminal Tp of a latch circuit 18 is connected to the drain of the NFET M11. A reference potential terminal Tg is connected to a ground. An output terminal Tq1 is connected to the gate of the NFET M11. Based on the voltage Vout, the control circuit 16 outputs voltages Vset and Vrst to a set terminal Tset and a reset terminal Trst of the latch circuit 18, respectively. When a high level is input as the voltage Vset to the terminal Tset, the latch circuit 18 outputs the voltage Vin of the power supply terminal Tp to the output terminal Tq1 until a high level is input to the terminal Trst. When a high level is input to the terminal Trst as the voltage Vrst, the latch circuit 18 outputs a voltage of 0 V at the reference potential terminal Tg to the output terminal Tq1 until a high level is input to the terminal Tset.

Figure 5:
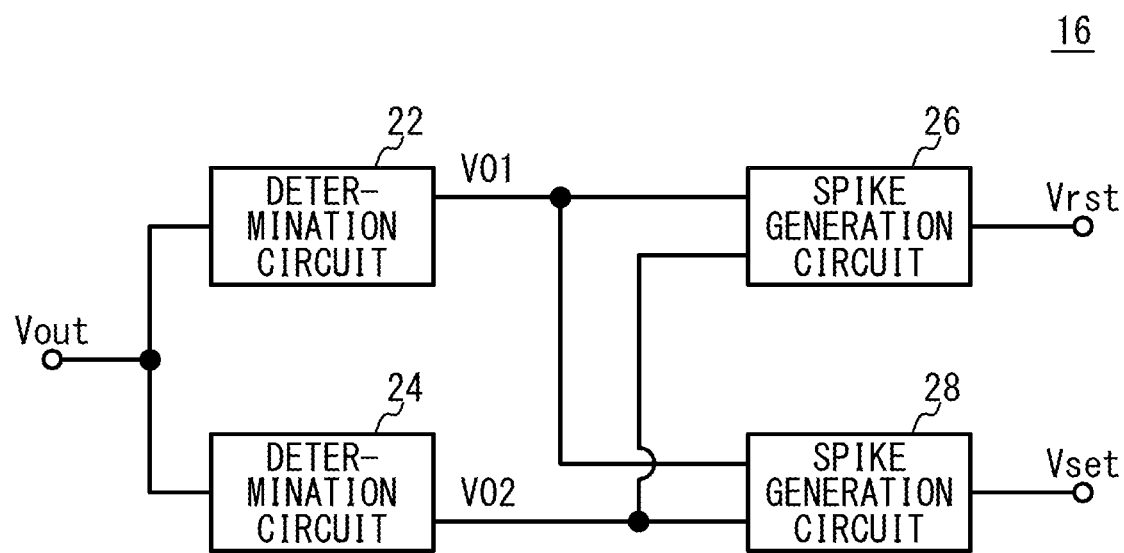
FIG. 5 is a circuit diagram of a control circuit in the first embodiment.

FIG. 5 is a circuit diagram of the control circuit 16 in the first embodiment. As illustrated in FIG. 5, the voltage Vout is input to determination circuits 22 and 24. The determination circuits 22 and 24 output the voltage Vout as voltages V01 and V02 when the voltage Vout is equal to or higher than reference voltages Vref1 and Vref2, respectively, and output the ground potential 0 V as the voltages V01 and V02 when the voltage Vout is lower than the reference voltages Vref1 and Vref2, respectively.

A spike generation circuit 26 outputs a spike signal as the reset voltage Vrst when both of the voltages V01 and V02 become high level. A spike generation circuit 28 outputs a spike signal as the set voltage Vset when both of the voltages V01 and V02 become low level. The spike generation circuits 26 and 28 do not require a clock signal, are composed of FETs, and consume power only when generating an output pulse width, and therefore, that power consumption is small. Thus, it is optimum as a circuit constituting a control circuit of a micro electromotive force element such as a piezoelectric element that generates power from vibration as a power generation element. The spike signal is a single signal, and the interval between the spike signals is sufficiently wide with respect to the pulse width of the spike signal.

Figure 6:
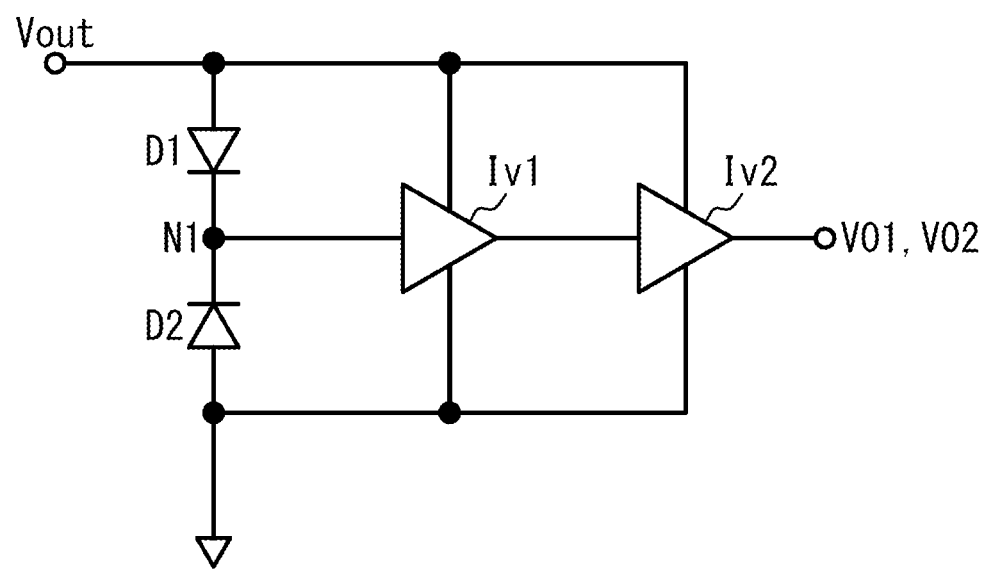
FIG. 6 is a circuit diagram of a determination circuit in the first embodiment.

FIG. 6 is a circuit diagram of the determination circuit in the first embodiment. As illustrated in FIG. 6, in the determination circuits 22 and 24, a diode D1 and a diode D2 are connected in series between the input terminal to which the voltage Vout is input and the ground, the diode D1 is connected in the forward direction, and the diode D2 is connected in the reverse direction. Although the connection states of the circuit elements are the same between the determination circuits 22 and 24, the sizes of the diodes D1 and D2 are separately set as described later. A node N1 between the diodes D1 and D2 outputs the voltages V01 and V02 via inverters Iv1 and Iv2. The inverters Iv1 and Iv2 use the voltage Vout as a power supply voltage. The reverse current flowing through the diode D2 is substantially constant regardless of the voltages at both ends. The forward current flowing through the diode D1 depends on the voltages at both ends. In a range in which the voltage Vout is low, the voltage at the node N1 hardly increases even when the voltage Vout increases, but in a range in which the voltage Vout is high, the voltage at the node N1 rapidly increases when the voltage Vout increases. When the voltage Vout is low, the voltage at the node N1 is low, the invertor Iv1 outputs the voltage Vout, and the invertor Iv2 outputs the ground potential 0 V. When the voltage at the node N1 rapidly increases due to the increase in the voltage Vout, the voltage at the node N1 becomes equal to or higher than the threshold voltage of the inverter Iv1. The inverter Iv1 outputs the ground potential 0 V, and the inverter Iv2 outputs the voltage Vout.

By appropriately setting the sizes of the diodes D1 and D2, a freely-selected reference voltage can be set so that the inverter Iv2 outputs the voltage Vout when the voltage Vout is equal to or higher than the reference voltage and outputs the ground potential 0 V when the voltage Vout is lower than the reference voltage. For example, when the diode D1 is made larger than the diode D2, the reference voltage can be made high, and when the diode D1 is made smaller than the diode D2, the reference voltage can be made low. The sizes of the diodes D1 and D2 in the determination circuits 22 and 24 are set so that the reference voltage is Vref1 in the determination circuit 22 and the reference voltage is Vref2, which is higher than Vref1, in the determination circuit 24. As a result, the determination circuits 22 and 24 output the voltages Vout as the voltages V01 and V02 when the voltage Vout is higher than the reference voltages Vref1 and Vref2, respectively, and output the ground potential 0 V as the voltages V01 and V02 when the voltage Vout is lower than the reference voltages Vref1 and Vref2.

Figure 7:
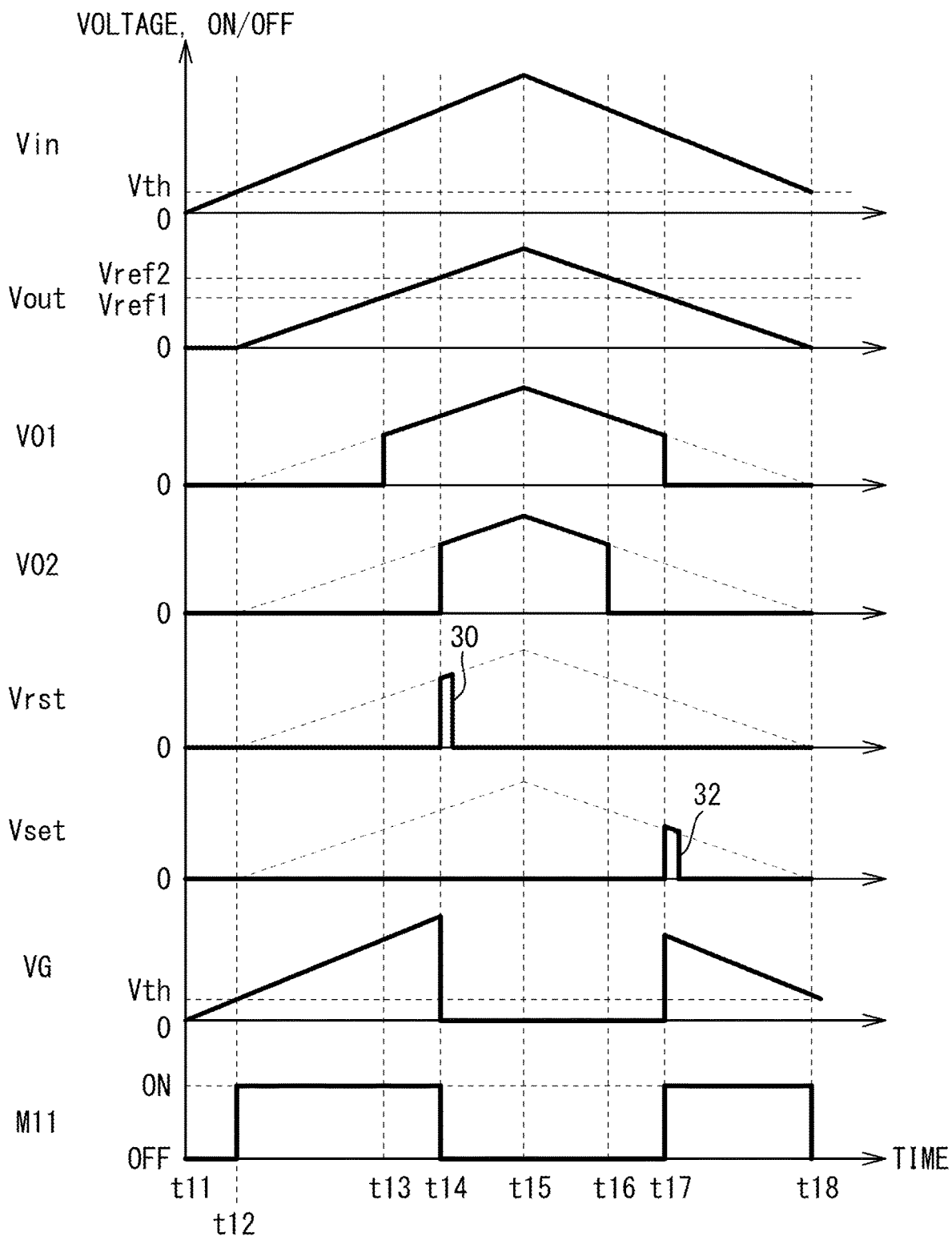
FIG. 7 is a diagram illustrating temporal changes of voltages and ON/OFF of an FET in the switching circuit in accordance with the first embodiment.

FIG. 7 is a diagram illustrating temporal changes of voltages and ON/OFF of an FET in the switching circuit in accordance with the first embodiment. The voltage Vout is indicated by broken lines for the voltages V01 and V02, the reset voltage Vrst, and the set voltage Vset. As illustrated in FIG. 7, at time t11, the voltage Vin is around the ground potential 0 V, and the voltage Vout of the capacitor C2 is around the ground potential 0 V. The voltages V01 and V02, the reset voltage Vrst, and the set voltage Vset are the ground potential 0 V. The voltage VG at the gate of the NFET M11 is the voltage Vin. The NFET M11 is off. After time t11, the voltage Vin rises. The latch circuit 18 is asymmetric, and the voltage VG at the output terminal Tq1 becomes the voltage Vin and rises.

At time t12, when the voltage VG reaches a threshold voltage Vth of the NFET M11, the NFET M11 is turned on. After time t12, since the NFET M11 is turned on, the capacitor C2 starts to be charged. As a result, the voltage Vout rises. The rates of rise of the voltages Vin and Vout may not be necessarily the same.

When the voltage Vout becomes equal to or higher than the reference voltage Vref1 at time t13, the determination circuit 22 outputs the voltage Vout as the voltage V01. When the voltage Vout becomes equal to or higher than the reference voltage Vref2 at time t14, the determination circuit 24 outputs the voltage Vout as the voltage V02. The spike generation circuit 26 outputs a spike signal 30 as the reset voltage Vrst when the voltages V01 and V02 both become the high level. The height of the spike signal 30 is the same as that of the voltage Vout. The latch circuit 18 outputs the ground potential 0 V, which is the voltage at the reference potential terminal Tg, to the output terminal Tq1 as the voltage VG. The NFET M11 is turned off. When the spike signal 30 is output, the control circuit 16 outputs activation as the enable signal Ven to the control unit 14. As a result, the voltage conversion circuit 12 is activated and starts operating. After time t14, the voltage Vout of the capacitor C2 increases due to the output voltage V2 of the voltage conversion circuit 12.

At time t15, the voltage Vin starts to decrease and the voltage Vout starts to decrease. When the voltage Vout becomes lower than the reference voltage Vref2 at time t16, the determination circuit 22 outputs the ground potential 0 V as the voltage V02. When the voltage Vout becomes lower than the reference voltage Vref1 at time t17, the determination circuit 24 outputs the ground potential 0 V as the voltage V01. When both the voltages V01 and V02 become the ground potential 0 V, the spike generation circuit 28 outputs a spike signal 32 as the set voltage Vset. The height of the spike signal 32 is the same as that of the voltage Vout. The latch circuit 18 outputs the voltage Vin, which is the voltage at the power supply terminal Tp, to the output terminal Tq1 as the voltage VG. The NFET M11 is turned on. When the spike signal 32 is output, the control circuit 16 outputs deactivation as the enable signal Ven to the control unit 14. As a result, the voltage conversion circuit 12 stops operating. At time t18, the voltage Vout becomes substantially 0.

According to the first embodiment, as illustrated in FIG. 4, the NFET M11 (first switching element) has the gate (first control terminal), and the connection state between the power generation element 10 and the capacitor C2 is controlled in accordance with the voltage applied to the gate. Then, as from time t11 to time t14 in FIG. 7, when the voltage difference Vout–0 V between both ends of the capacitor C2 increases from the initial state (e.g., 0 V) with time, the circuit 17 outputs a first voltage, which keeps the NFET M11 on, until the voltage deference Vout–0 V becomes the reference voltage Vreft (first predetermined value), which is greater than the initial state. When the voltage difference Vout–0 V exceeds the reference voltage Vref2, the circuit 17 outputs a second voltage, which keeps the NFET M11 off, to the gate until the voltage difference Vout–0 V becomes lower than the reference voltage Vref (second predetermined value).

As a result, the NFET M11 in the cold start switch CSW is turned on without power supply. When the reset voltage Vrst is input at time t14, the latch circuit 18 outputs the ground potential (see FIG. 7) to the output terminal Tq1. This allows the NFET M11 to be turned off. Thus, the cold start switch CSW can be controlled stably.

The control circuit 16 outputs the reset voltage Vrst when the voltage difference between the voltage Vout and the ground potential increases with time and becomes equal to or greater than the reference voltage Vref2 (first reference voltage). The control circuit 16 also outputs the enable signal Ven that activates the voltage conversion circuit 12. As a result, the voltage Vout increases, and the cold start switch CSW can be turned off when the power stored in the capacitor C2 is used, for example, as the power supply for the voltage conversion circuit 12. The determination circuits 22 and 24 illustrated in FIG. 5 function as a determination circuit that determines whether the voltage difference between the voltage Vout and the ground potential exceeds the reference voltage Vref2. The spike generation circuit 26 and the control circuit 16 function as a generation circuit that generates the enable signal Ven when it is determined that the voltage difference exceeds the reference voltage Vref2.

The control circuit 16 outputs the set voltage Vset when the voltage difference between the voltage Vout and the ground potential 0 V decreases with time and becomes equal to or less than the reference voltage Vref1 (second reference voltage). The output of the latch circuit 18 is switched from the second voltage to the first voltage. That is, the latch state of the latch circuit is reset. As a result, the cold start switch CSW can be turned on when the voltage Vout decreases and the power stored in the capacitor C2 is no longer used as the power supply for the voltage conversion circuit 12, for example.

Figure 8A:
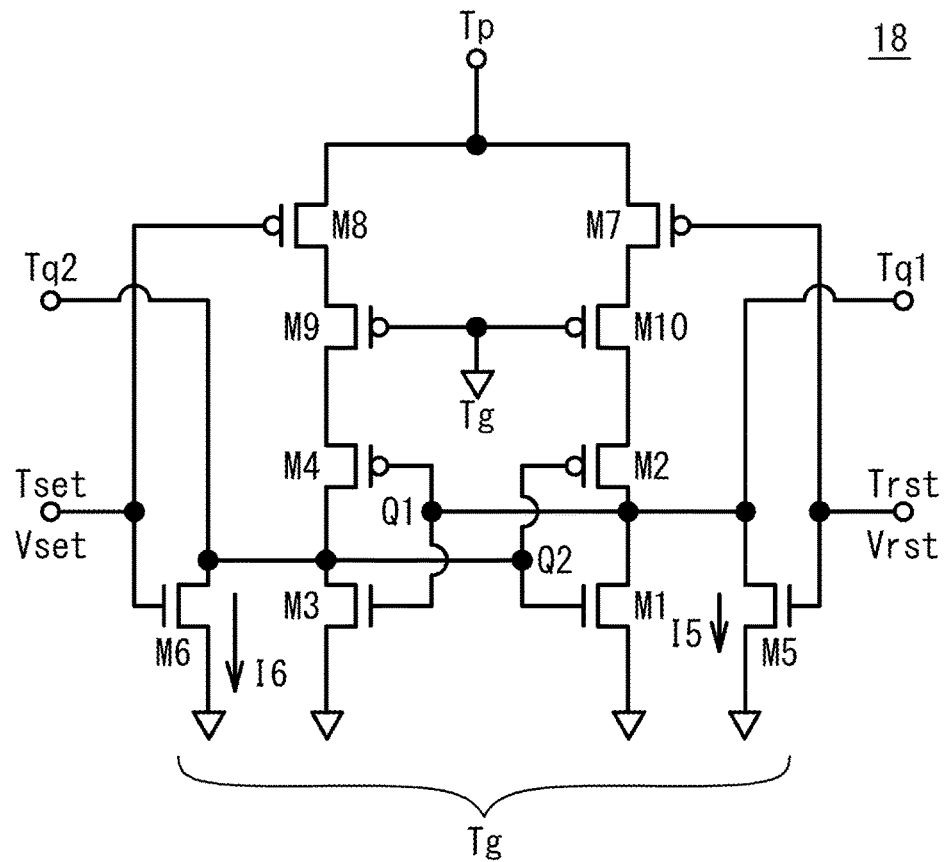
FIG. 8A and FIG. 8B are circuit diagrams of a latch circuit in the first embodiment.
Figure 8B:
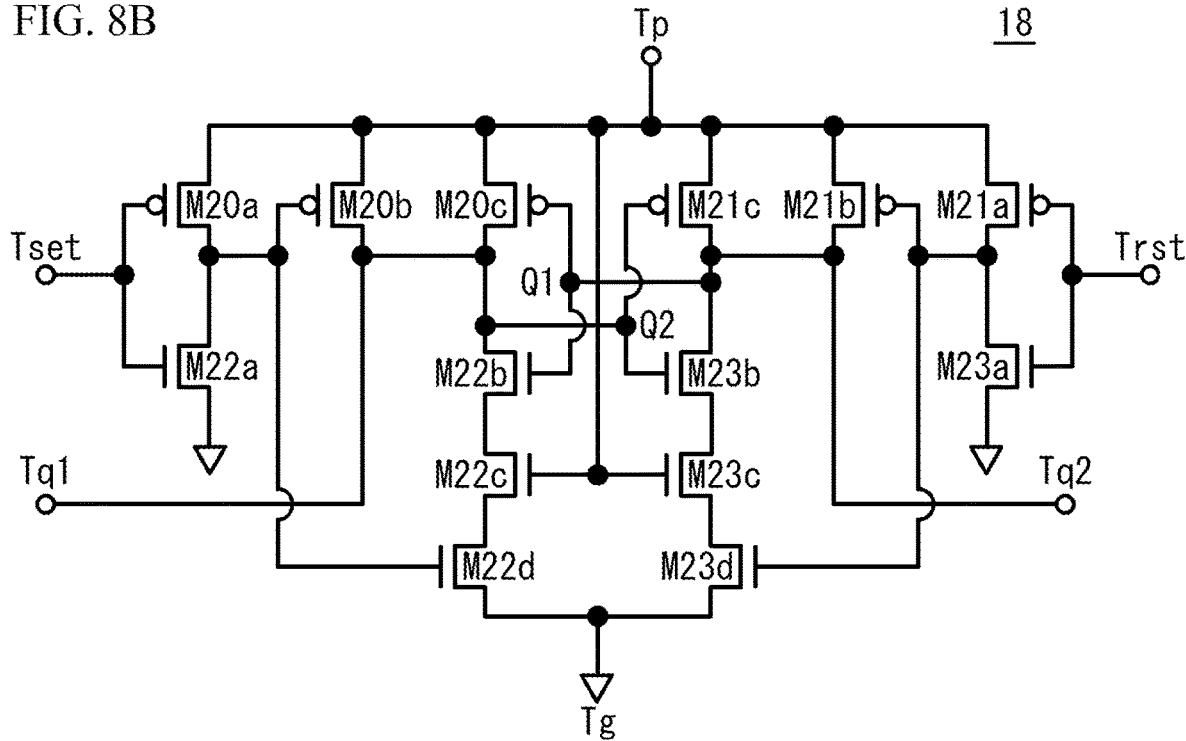

FIG. 8A and FIG. 8B are circuit diagrams of the latch circuit 18 in the first embodiment. In FIG. 8A, an NOR type latch circuit will be described as an example of the latch circuit 18. PFETs M7, M10, M2 and an NFET M1 are connected in series between the power supply terminal Tp and the reference potential terminal Tg. PFETs M8, M9, M4 and an NFET M3 are connected in series between the power supply terminal Tp and the reference potential terminal Tg and are connected in parallel with these FETs. The gates of the PFETs M8 and M7 are connected to the set terminal Tset and the reset terminal Trst, respectively. The gates of the PFETs M9 and M10 are connected to the reference potential terminal Tg.

The drains of the PFET M2 and the NFET M1 are commonly connected to a node Q1, and the gates of the PFET M2 and the NFET M1 are commonly connected to a node Q2. The drains of the PFET M4 and the NFET M3 are commonly connected to the node Q2, and the gates of the PFET M4 and the NFET M3 are commonly connected to the node Q1. The PFET M4 and the NFET M3 form an inverter, and the PFET M2 and the NFET M1 form an inverter. The nodes Q1 and Q2 are memory nodes and hold voltages complementary to each other.

The node Q1 is connected to the output terminal Tq1, and the node Q2 is connected to an output terminal Tq2. The nodes Q1 and Q2 are connected to the reference potential terminal Tg via the NFETs M5 and M6, respectively. The gates of the NFETs M5 and M6 are connected to the reset terminal Trst and the set terminal Tset, respectively.

When the voltage Vrst is at a low level while the node Q1 is at a high level and the node Q2 is at a low level, the NFETs M1 and M5 are off, the PFETs M2, M10, and M7 are on, the NFETs M3 and M6 are on, and the PFETs M4, M9, and M8 are off. When the voltage Vrst becomes a high level, the NFET M5 is turned on and the node Q1 becomes a low level. Further, the PFET M7 is turned off. As a result, the node Q1 is switched to a low level and the node Q2 is switched to a high level. When the voltage Vset becomes a high level while the node Q1 is at a low level and the node Q2 is at a high level, similarly, the node Q1 is switched to a high level and the node Q2 is switched to a low level.

As described above, when the voltage Vset of a high level is input to the set terminal Tset, the latch circuit 18 outputs the voltage at the power supply terminal Tp to the output terminal Tq1 and outputs the voltage at the reference potential terminal Tg to the output terminal Tq2 until the voltage Vrst of a high level is input to the reset terminal Trst next time. When the voltage Vrst of a high level is input to the reset terminal Trst, the latch circuit 18 outputs the voltage at the reference potential terminal Tg to the output terminal Tq1 and outputs the voltage of the power supply terminal Tp to the output terminal Tq2 until the voltage Vset of a high level is input to the set terminal Tset next time.

The drains of the PFETs M7 and M8 may be directly connected to the sources of the PFETs M2 and M4 without providing the PFETs M9 and M10. When the levels of the nodes Q1 and Q2 are inverted, a current flows from the power supply terminal Tp to the reference potential terminal Tg. The PFETs M9 and M10 are provided so that a large current does not flow when the voltage at the power supply terminals Tp is high.

In the latch circuit in which the nodes Q1 and Q2 are symmetrical, when the power supply voltage (the voltage of the power supply terminal Tp with respect to the reference potential terminal Tg) increases from 0 V, it is not determined which of the nodes Q1 and Q2 becomes the voltage (high level) at the power supply terminal Tp. In the latch circuit 18, the nodes Q1 and Q2 are asymmetric, and when the power supply voltage of the latch circuit 18 rises from 0 V, the voltage at the node Q1 becomes a high level. Thus, in order to achieve asymmetry, the gate width of the NFET M5 is adjusted to be narrower than the gate width of the NFET M6. As an example, the gate length of the NFET is 0.8 μm, the gate length of the PFET is 5 μm, the gate width of the PFET is 0.6 μm, and the gate widths of the NFETs M1 and M3 are 0.8 μm. In this case, the gate widths of the NFETs M5 and M6 are 15 μm and 60 μm, respectively. Thus, when the power supply voltage rises from 0 V, a current I6 flowing through the NFET M6 is larger than a current IS flowing through the NFET M5, and the voltage at the node Q2 becomes lower than the voltage at the node Q1. Therefore, the latch circuit 18 rises so that the node Q1 becomes the voltage at the power supply terminal Tp. Other parameters may be changed as long as the nodes Q1 and Q2 rise asymmetrically. For example, the gate width of the NFET M1 is adjusted to be narrower than that of the NFET M3. The gate widths of the PFETs M2, M10, and M7 are adjusted to be wider than the gate widths of the PFETs M4, M9 and M8, respectively. Thus, when the power supply voltage rises from 0 V, the voltage at the node Q2 becomes lower than the voltage at the node Q1. The gate widths of the NFETs M5 and M6 are larger than those of other FETs in order to switch the levels of nodes Q1 and Q2 by voltages Vset and Vrst of about 1 V even when the voltage at the power supply terminal Tp increases to about 5 V, for example.

FIG. 8B illustrates an example of a NAND type latch circuit. The latch circuit 18 includes PFETs M20a to M20c and M21a to M21c, NFETs M22a to M22d and M23a to M23d. The operation of the latch circuit 18 is the same as that illustrated in FIG. 8A, and the description thereof is omitted. The latch circuit 18 may have a circuit configuration other than those illustrated in FIG. 8A and FIG. 8B as long as the above-described operation is performed.

The latch circuit 18 illustrated in FIG. 8A and FIG. 8B) is used as a circuit for applying the voltage VG to the gate of the FET M11 illustrated in FIG. 4. When the reset voltage Vrst (first control signal) is input, the latch circuit 18 continues to output the second voltage, which turns off the NFET M11, to the gate of the NFET M11. By using such a latch circuit 18, the latch circuit 18 can output the first voltage to the output terminal Tq1 before the reset voltage Vrst is input, and can output the second voltage to the output terminal Tq1 when the reset voltage Vrst is input. The circuit that generates the second voltage to turn off the NFET M11 can be achieved simply.

When the set voltage Vset (second control signal) is input, the latch circuit 18 outputs the first voltage, which turns on the NFET M11, to the gate of the NFET M11 until the reset voltage Vrst is input. Thus, when the set voltage Vset is input to the latch circuit 18, the voltage VG at the gate of the NFET M11 becomes the first voltage, and the NFET M11 can be turned on.

First Variation of First Embodiment

In a first variation of the first embodiment, a PFET is used as the cold start switch CSW. In this case, the first terminal and the second terminal are the drain and the source of the PFET, respectively.

Figure 9A:
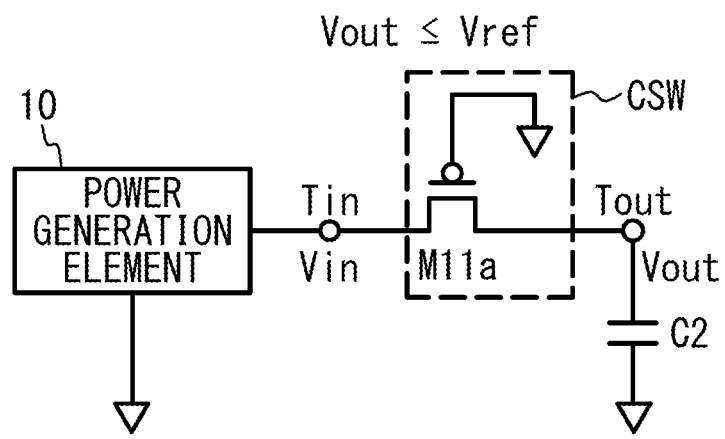
FIG. 9A and FIG. 9B are circuit diagrams of a switching circuit in accordance with a first variation of the first embodiment.
Figure 9B:
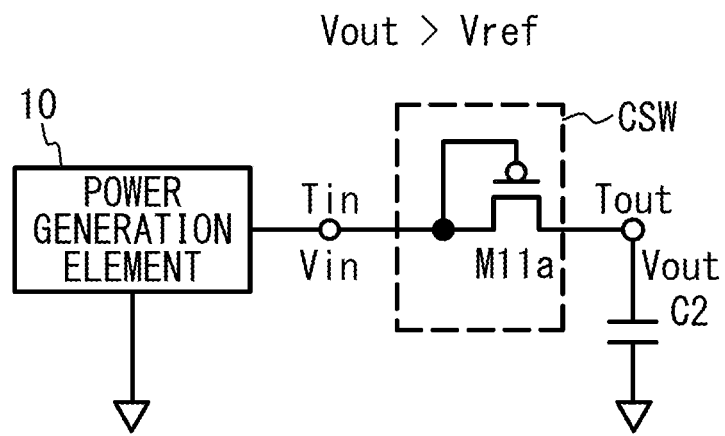

FIG. 9A and FIG. 9B are circuit diagrams of the switching circuit in accordance with the first variation of the first embodiment. As illustrated in FIG. 9A, in the first variation of the first embodiment, a PFET M11a of an enhancement mode is used as the cold start switch CSW. The threshold voltage of the PFET M11a is negative. The source of the PFET M11a is connected to the input terminal Tin and the drain is connected to the output terminal Tout. When the voltage Vout is equal to or lower than the reference voltage Vref, the gate of the PFET M11a is connected to a ground without power supply. Thus, the PFET M11a is turned on when the ground potential with respect to the voltage Vin becomes equal to or lower than the threshold voltage of the PFET M11a. As illustrated in FIG. 9B, when the voltage Vout is higher than the reference voltage Vref, the input terminal Tin is connected to the gate of the PFET M11a. Thus, the PFET M11a is turned off.

Figure 10:
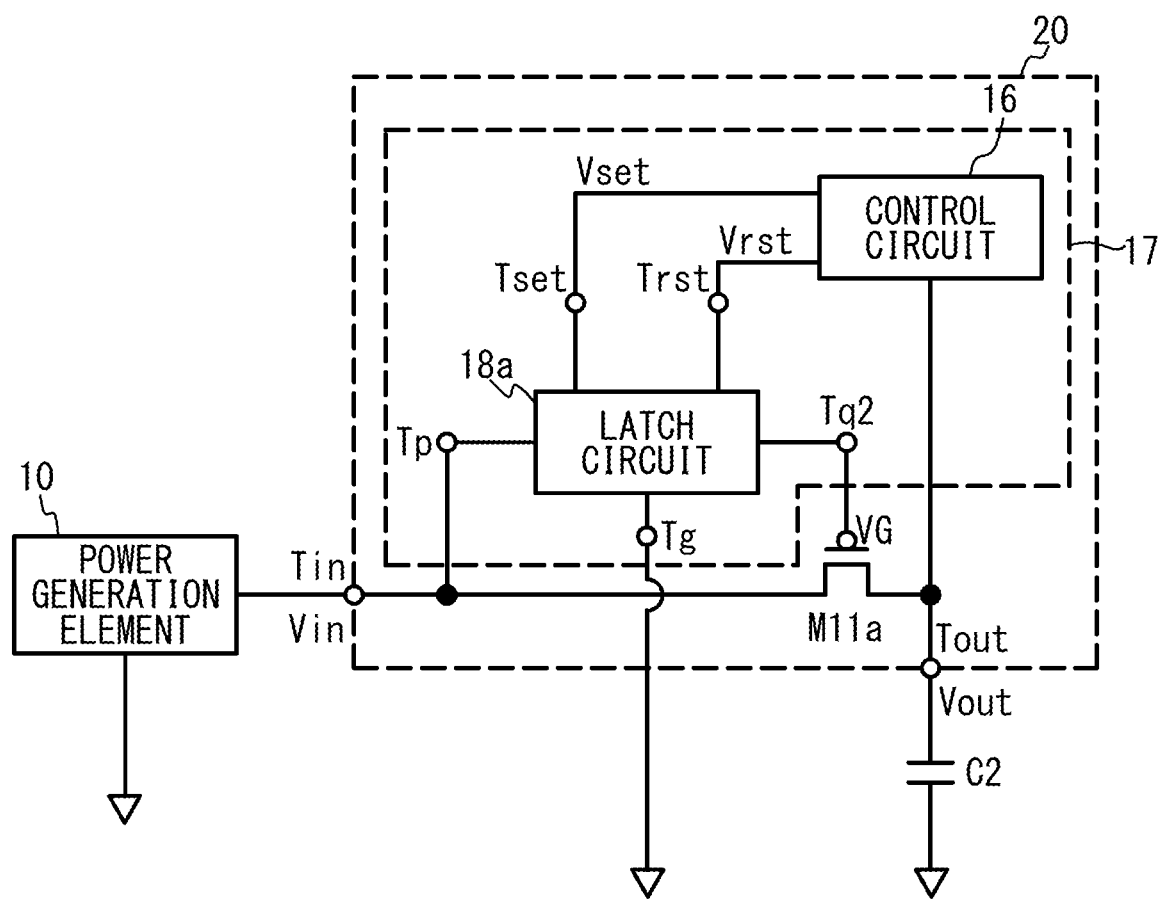
FIG. 10 is a circuit diagram of the switching circuit in accordance with the first variation of the first embodiment.

FIG. 10 is a circuit diagram of a switching circuit in accordance with the first variation of the first embodiment. As illustrated in FIG. 10, in the first variation of the first embodiment, the NFET M11 is replaced with the enhancement type PFET M11a as compared with FIG. 4 of the first embodiment. The source of the PFET M11a is connected to the input terminal Tin, the drain is connected to the output terminal Tout, and the gate is connected to the output terminal Tq2 of a latch circuit 18a. The configuration of the latch circuit 18a is the same as that of the latch circuit 18 of the first embodiment, except that the output terminal Tq2 is connected to the gate of the PFET M11a. Other circuit configurations are the same as those in FIG. 4 of the first embodiment, and the description thereof is omitted.

Figure 11:
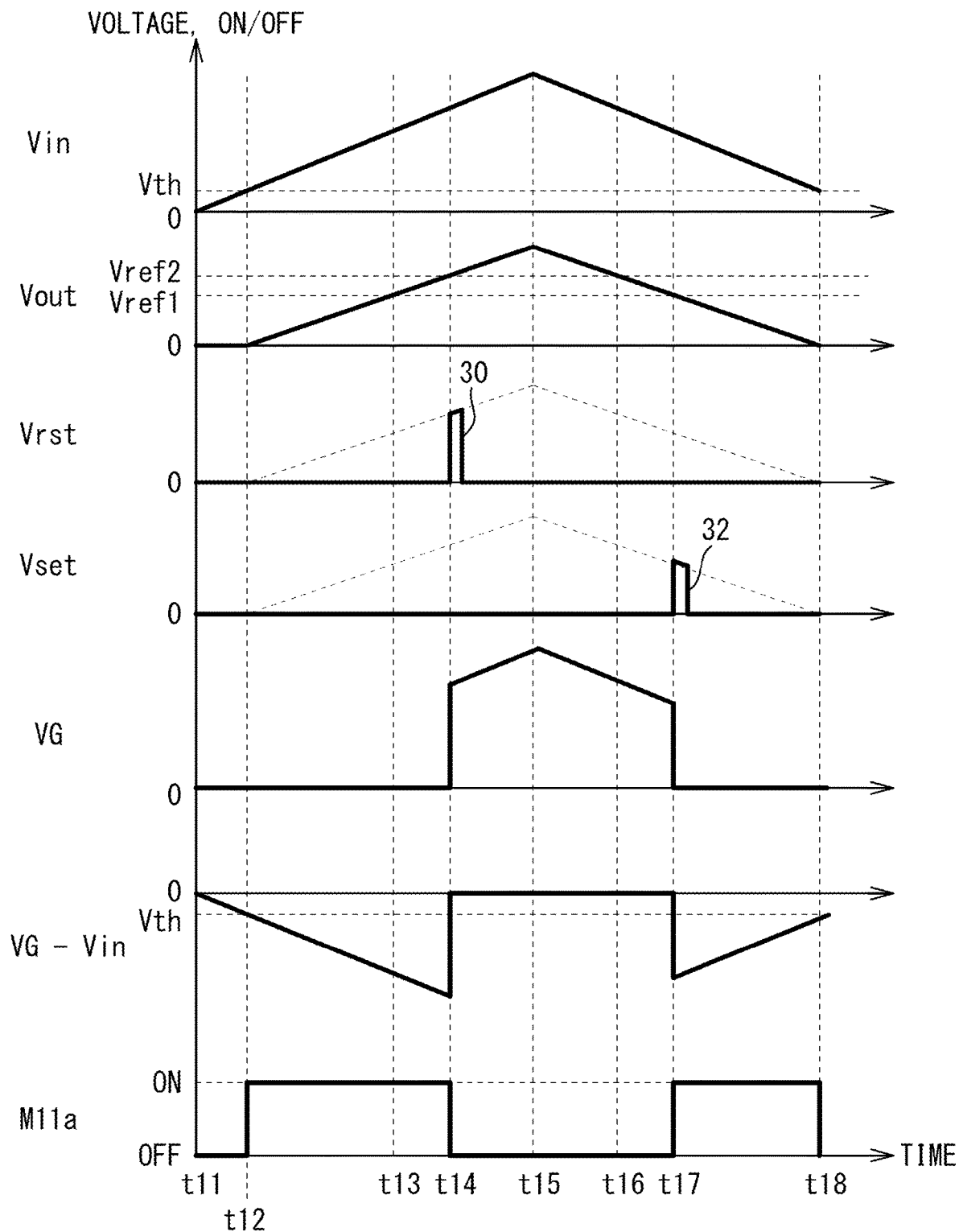
FIG. 11 is a diagram illustrating temporal changes of voltages and ON/OFF of an FET in the switching circuit in accordance with the first variation of the first embodiment.

FIG. 11 is a diagram illustrating temporal changes of voltages and ON/OFF of an FET in the switching circuit in accordance with the first variation of the first embodiment. The gate voltage with respect to the source voltage of the PFET M11a is illustrated as the voltage VG–Vin. The threshold voltage of the PFET M11a is negative. As illustrated in FIG. 11, the change in the voltage Vin with respect to time is the same as that of FIG. 7. At time t11, the voltage VG at the gate of the PFET M11a is the ground potential 0 V. The PFET M11a is off. After time t11, the voltage Vin increases. The voltage VG–Vin is –Vin. The latch circuit 18 is asymmetric, and when the power supply voltage of the latch circuit 18 increases from 0 V, the voltage of the output terminal Tq2 becomes a low level (that is, ground potential). Even when the voltage Vin increases, the voltage at the output terminal Tq2 remains at the ground potential 0 V.

When the voltage VG–Vin reaches the threshold voltage Vth of the PFET M11a at time t12, the PFET M11a turns on. After time t12, the voltage Vout increases. When the voltage Vout becomes equal to or higher than the reference voltage Vref2 at time t14, the control circuit 16 outputs the spike signal 30 as the reset voltage Vrst to the reset terminal Trst of the latch circuit 18. The latch circuit 18 outputs the voltage Vin, which is the voltage at the power supply terminal Tp, to the output terminal Tq2 as the voltage VG. As a result, the voltage VG–Vin becomes substantially 0 V. Thus, the PFET M11a turns off.

When the voltage Vout becomes lower than the reference voltage Vref1 at time t17, the control circuit 16 outputs the spike signal 32 as the set voltage Vset to the set terminal Tset of the latch circuit 18. The latch circuit 18 outputs the ground potential 0 V, which is the voltage at the reference potential terminal Tg, to the output terminal Tq2 as the voltage VG. As a result, the voltage VG–Vin becomes –Vin and the PFET M11a is turned on. Other configurations and operations are the same as those of the first embodiment, and the description thereof will be omitted.

In the first embodiment and the first variation thereof, the input voltage Vin is higher than the ground potential. In this case, when the NFET M11 is used for the cold start switch CSW as in the first embodiment, the first voltage, which turns on the NFET M11, is the input voltage Vin. When the PFET M11a is used as the cold start switch CSW as in the first variation of the first embodiment, the first voltage, which turns on the PFET M11a, is the voltage of the ground potential. This configuration allows the NFET M11 and the PFET M11a to be stably turned on.

When the NFET M11 is used for the cold start switch CSW as in the first embodiment, the second voltage, which turns off the NFET M11, is the voltage of the ground potential. When the PFET M11a is used for the cold start switch CSW as in the first variation of the first embodiment, the second voltage, which turns off the PFET M11a, is the voltage Vin. This eliminates the need for an extra circuit for generating –α or +α used in second and third variations of the first embodiment.

In the first embodiment, when the voltage Vout becomes higher than the voltage Vin between time t14 and time t17 in FIG. 7, the voltage VG is the ground potential 0 V and is lower than both the voltages Vout and Vin. Therefore, the gate voltage of the NFET M11 is lower than the source voltage. Thus, the NFET M11 is off. In the first variation of the first embodiment, when the voltage Vout becomes higher than the voltage Vin between time t14 and time t17 in FIG. 11, the voltage VG is the voltage Vin and is lower than the voltage Vout. Therefore, when the voltage Vin–Vout becomes lower than the threshold voltage of the PFET M11a, the PFET M11a is turned on, and a current flows back from the terminal Tout to the terminal Tin. Therefore, the cold start switch CSW is preferably the NFET M11 as in the first embodiment.

Second Variation of First Embodiment

Figure 12A:
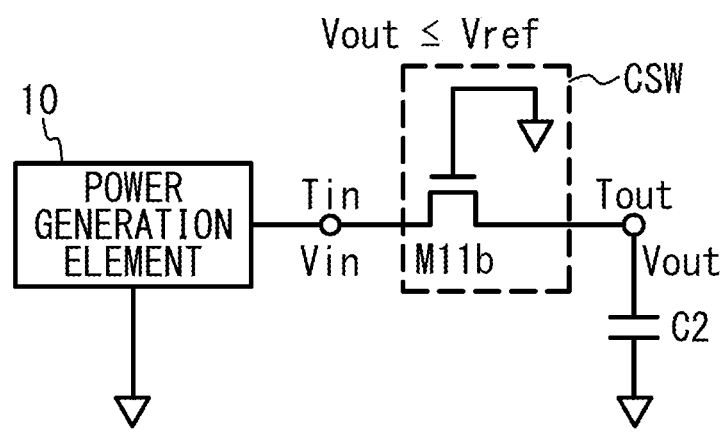
FIG. 12A and FIG. 12B are circuit diagrams of a switching circuit in accordance with a second variation of the first embodiment.
Figure 12B:
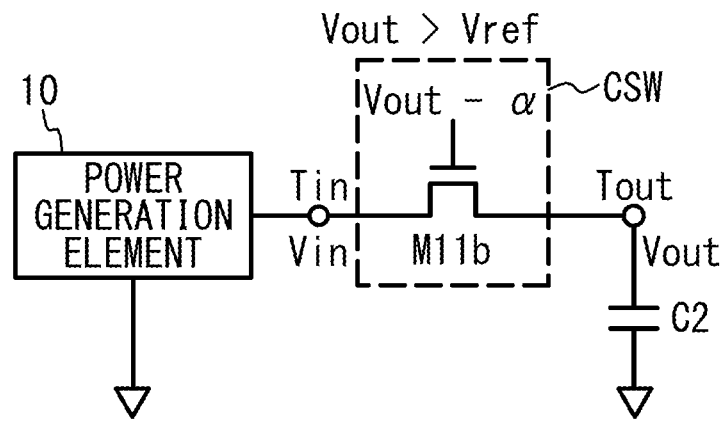

A second variation of the first embodiment is an example in which a depletion mode (normally-on mode) is used as the cold start switch. FIG. 12A and FIG. 12B are circuit diagrams of a switching circuit in accordance with the second variation of the first embodiment. As illustrated in FIG. 12A, in the second variation of the first embodiment, an NFET M11b of a depletion mode is used as the cold start switch CSW. The threshold voltage of the NFET M11b is negative. The source of the NFET M11b is connected to the output terminal Tout and the drain is connected to the input terminal Tin. When the voltage Vout is equal to or lower than the reference voltage Vref, the gate of the NFET M11b is connected to a ground without power supply. As a result, the NFET M11b is turned on. As illustrated in FIG. 12B, when the voltage Vout is higher than the reference voltage Vref, a voltage Vout–α (α is positive) is applied to the gate of the NFET M11b. When –α is equal to or less than the threshold voltage of the NFET M11b, the NFET M11b is turned off.

In the second variation of the first embodiment in which the NFET of a depletion mode is used as the cold start switch CSW, the leakage current of the NFET M11b becomes large unless –α is sufficiently lower than the reference voltage in FIG. 12B. When a PFET of a depletion mode is used as the cold start switch CSW, the threshold voltage of the PFET is positive. In order to reduce the leakage current of the PFET when the PFET is off, +α, which is sufficiently higher than the threshold voltage, is applied to the gate of the PFET. However, an extra circuit is required to generate a sufficiently low –α or a sufficiently high +α, thereby also consuming extra power. In the first embodiment and the first variation thereof, the use of the enhancement-type transistor eliminates the need for an extra circuit for generating –α or +α. As a result, extra power can be reduced.

The voltage Vin output from the latch circuit 18 to the gates of the NFET M11 and the PFET M11a may be a voltage dropped from the voltage Vin at the output terminal Tout by the parasitic resistance of the latch circuit 18. Further, the voltage of the ground potential 0 V output by the latch circuit 18 to the gates of the NFET M11 and the PFET M11a may be a voltage increased from the ground potential by the parasitic resistance of the latch circuit 18.

Second Embodiment

A second embodiment and a variation thereof are examples in which the input voltage Vin is lower than the ground, the output of the power generation element 10 is negative with respect to the ground, and the voltage V2 of the capacitor C2 is negative. In the second embodiment, the PFET M11a of an enhancement mode is used as the cold start switch CSW. The circuit configuration is the same as that of FIG. 9A and FIG. 9B of the first variation of the first embodiment, and the description thereof will be omitted.

Figure 13:
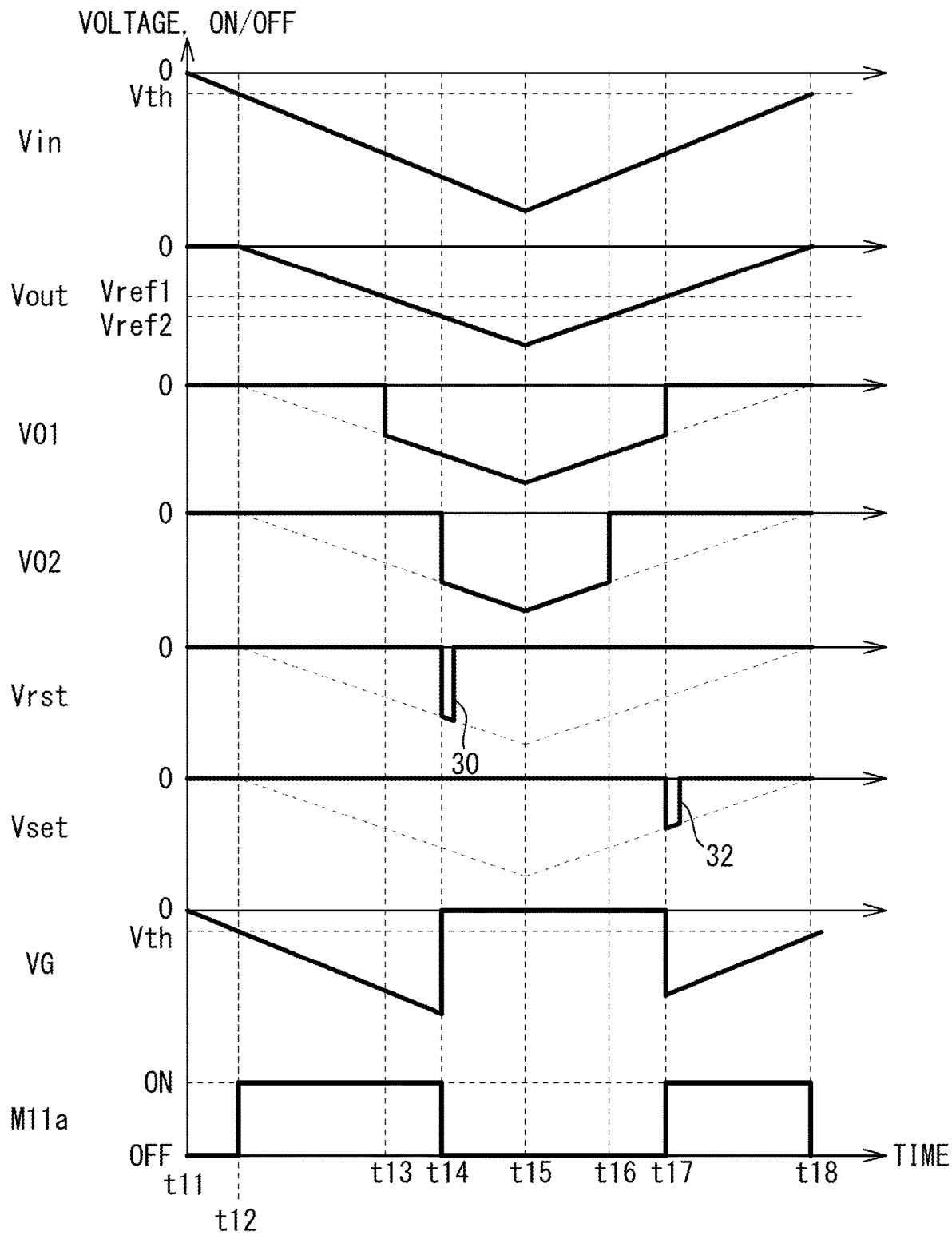
FIG. 13 is a diagram illustrating temporal changes of voltages and ON/OFF of an FET in the switching circuit in accordance with the second embodiment.

FIG. 13 is a diagram illustrating temporal changes of voltages and ON/OFF of an FET in a switching circuit in accordance with the second embodiment. As illustrated in FIG. 13, the voltages Vin, Vout, V01, V02, the reset voltage Vrst, the set voltage Vset, and the voltage VG are negative. The threshold voltage Vth of the PFET M11a is negative. The reference voltages Vref1 and Vref2 are negative. Between time t12 and time t14 and between time t17 and time t18, the voltage VG becomes equal to or lower than the threshold voltage Vth, and therefore, the PFET M11a turns on. Since the voltage VG is higher than the threshold voltage Vth between time t14 and time t17, the PFET M11a turns off. Other configurations are the same as those in FIG. 7 of the first embodiment, and the description thereof is omitted.

First Variation of Second Embodiment

Figure 14:
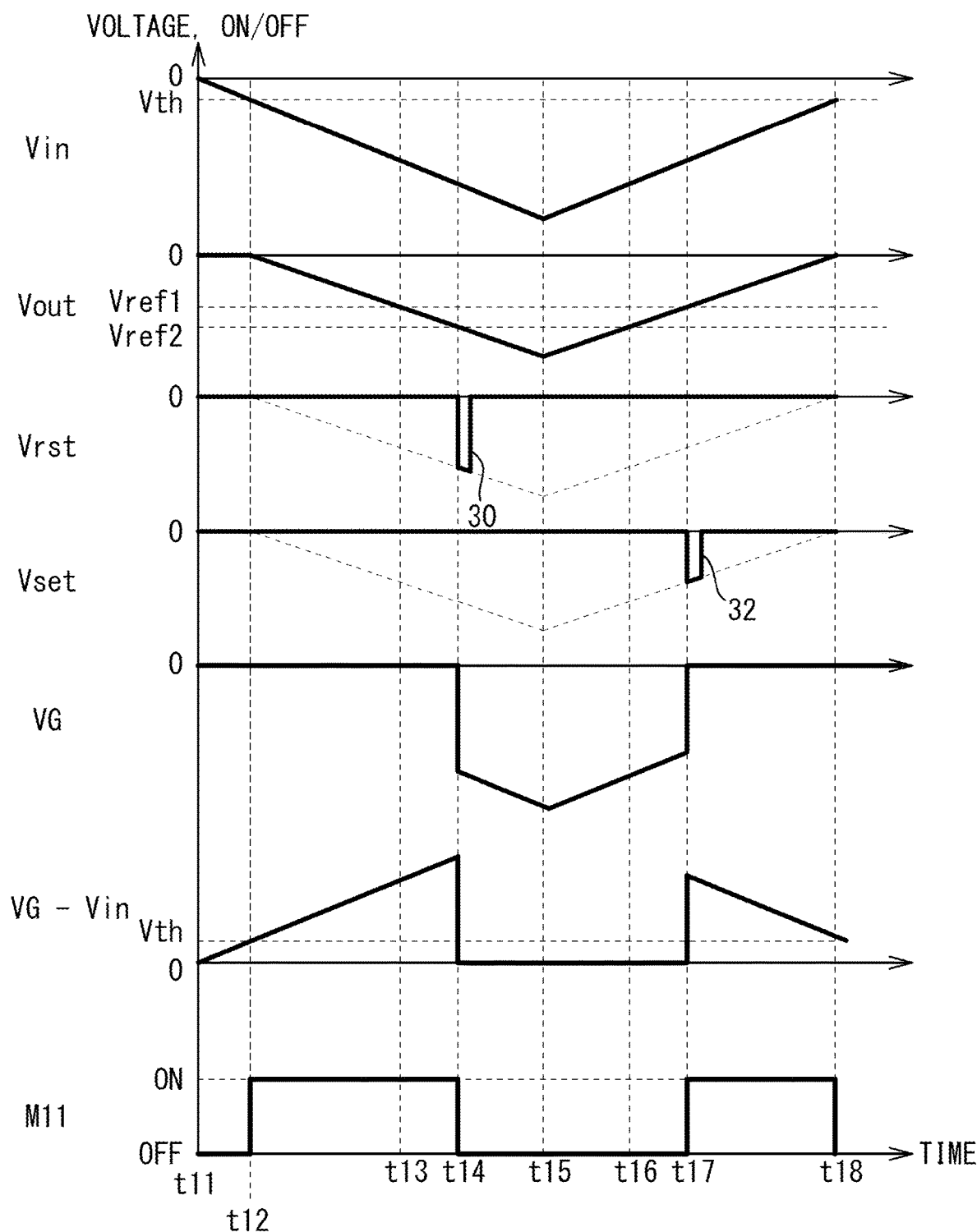
FIG. 14 is a diagram illustrating temporal changes of voltages and ON/OFF of an FET in a switching circuit in accordance with a first variation of the second embodiment.

In a first variation of the second embodiment, the NFET M11 of an enhancement mode is used as the cold start switch CSW. The circuit configuration is the same as that illustrated in FIG. 4 of the first embodiment, and the description thereof is omitted. FIG. 14 is a diagram illustrating temporal changes of voltages and ON/OFF of an FET in a switching circuit in accordance with the first variation of the second embodiment. As illustrated in FIG. 14, the threshold voltage Vth of the NFET M11 is positive. The reference voltages Vref1 and Vref2 are negative. Between time t12 and time t14 and between time t17 and time t18, the voltage VG–Vin becomes equal to or higher than the threshold voltage Vth, and therefore, the NFET M11 is turned on. Between time t14 and time t17, the voltage VG–Vin is substantially 0 V and lower than the threshold voltage Vth, and therefore, the NFET M11 is turned off. Other configurations are the same as those of the second embodiment illustrated in FIG. 13, and the description thereof is omitted.

In the second embodiment and the first variation thereof, the input voltage Vin is lower than the ground potential. In this case, when the PFET M11a is used for the cold start switch CSW as in the second embodiment, the first voltage, which turns on the PFET M11a, is the ground potential. When the NFET M11 is used for the cold start switch CSW as in the first variation of the second embodiment, the first voltage, which turns on the NFET M11, is the voltage Vin. Thus, the NFET M11 and the PFET M11a can be stably turned on.

When the PFET M11a is used for the cold start switch CSW as in the second embodiment, the second voltage, which turns off the PFET M11a, is the voltage Vin. When the NFET M11 is used for the cold start switch CSW as in the first variation of the second embodiment, the second voltage, which turns off the NFET M11, is the ground potential. Therefore, the need for an extra circuit for generating –α or +α is eliminated.

In the second embodiment, when the voltage Vout becomes higher than the voltage Vin between time t14 and time t17 in FIG. 13, the voltage VG is the ground potential 0 V, which is higher than both the voltages Vout and Vin. Therefore, the gate voltage of the PFET M11a is higher than the source voltage. Thus, the PFET M11a is off. In the first variation of the second embodiment, when the voltage Vout becomes lower than the voltage Vin between time t14 and time t17 in FIG. 14, the voltage VG is the voltage Vin, which is higher than the voltage Vout. For this reason, when the voltage Vin–Vout becomes higher than the threshold voltage of the NFET M11, the NFET M11 is turned on and a current flows back from the terminal Tin to the terminal Tout. Therefore, the cold start switch CSW is preferably the PFET M11a as in the second embodiment.

Third Embodiment

In the first embodiment, when the NFET M11 is on, a voltage drop occurs because the NFET M11 is diode-connected. Therefore, as in the first variation of the first embodiment, the PFET M11a may be used instead of the NFET M11. However, in the first variation of the first embodiment, when the voltage Vout becomes higher than the voltage Vin, the current flows back from the terminal Tout to the terminal Tin. This may cause power loss. A third embodiment is an example of a switching circuit that inhibits a backflow of a current from the terminal Tout to the terminal Tin even when the voltage Vout becomes higher than the voltage Vin.

Figure 15:
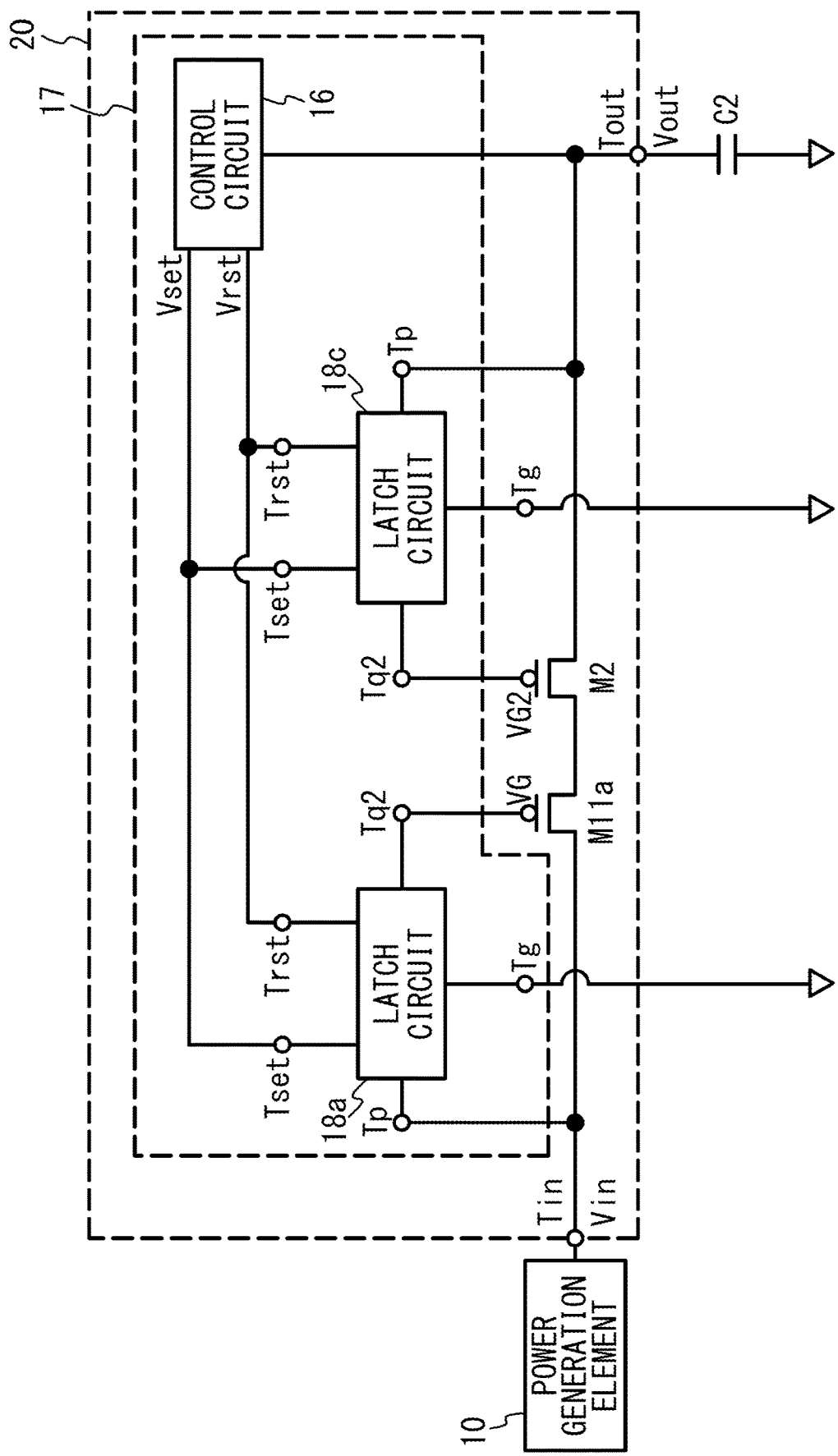
FIG. 15 is a circuit diagram of a switching circuit in accordance with a third embodiment.

FIG. 15 is a circuit diagram of a switching circuit in accordance with the third embodiment. As compared with FIG. 10 of the first variation of the first embodiment, the switching circuit 20 further includes a PFET M2 and a latch circuit 18c. The source of the PFET M2 is connected to the drain of the PFET M11a, and the drain is connected to the output terminal Tout. The power supply terminal Tp of the latch circuit 18c is connected to the drain of the PFET M2. The reference potential terminal Tg of the latch circuit 18c is connected to a ground. The output terminal Tq2 of the latch circuit 18c is connected to the gate of the PFET M2. The voltages Vset and Vrst are input to the set terminal Tset and the reset terminal Trst of the latch circuit 18c from the control circuit 16, respectively. Other circuit configurations are the same as those of FIG. 10 of the first variation of the first embodiment, and the description thereof is omitted.

The operation of the switching circuit in the third embodiment will be described with reference to FIG. 11. In order to simplify the description, it is assumed that the threshold voltages of the PFETs M11a and M2 are substantially 0 V and time t11 and time t12 are substantially the same. In FIG. 11, from time t11 to time t14 and from time t17 to time t18, the voltage VG applied to the gate of PFET M11a and the voltage VG2 applied to the gate of the PFET M2 are 0 V, and from time t14 to time t17, the voltages VG and VG2 are Vout. Thus, the PFET M2 turns on when the PFET M11a is on and turns off when the PFET M11a is off. Therefore, the switching circuit of the third embodiment performs the operation substantially the same as that of the switching circuit 20 of the first variation of the first embodiment, i.e., that illustrated in FIG. 11.

As described above, in the third embodiment, the connection state between the PFET M2 (second switching element) and the PFET M11a (first switching element) and the connection state between the PFET M2 and the capacitor C2 are controlled in accordance with the voltage applied to the gate (second control terminal). The circuit 17 outputs 0 V (first voltage), which keeps the PFET M2 on, to the gate of the PFET M2 until the voltage difference Vout–0 V between both ends of the capacitor C2 becomes the reference voltage Vref2. When the voltage difference Vout–0 V exceeds the reference voltage Vref2, the circuit 17 outputs Vout (second voltage), which keeps the PFET M2 off, to the gate of the PFET M2 until the voltage difference Vout–0 V becomes lower than the reference voltage Vref1. As a result, even when the voltage Vout becomes higher than the voltage Vin while the PFET M11a and the PFET M2 are off, the gate voltage VG2 of the PFET M2 is Vout and the PFET M2 remains off. Therefore, it is possible to inhibit a current from flowing backward from the terminal Tout to the terminal Tin. Therefore, it is possible to prevent power loss and reduce a decrease in power efficiency.

Although the third embodiment has described an example in which enhancement-type PFETs are used as the PFET M11a and the PFET M2 in the case that the input voltage Vin is higher than the ground potential, in the case that the input voltage Vin is lower than the ground potential, enhancement-type NFETs may be used instead of the PFET M11a and the PFET M2.

Fourth Embodiment

A fourth embodiment is an example in which the output voltage (that is, the input voltage Vin) of the power generation element 10 is high. For example, in the case that an element having a small capacitance component such as an organic piezoelectric element or a micro electro mechanical systems (MEMS) element using an electret is used as the power generation element, the output voltage of the power generation element 10 is high, for example, 35 V. In such a case, a high withstand voltage FET is used as the NFET M11 of the first embodiment. The high withstand voltage FET is an FET having a high drain withstand voltage (withstand voltage of the drain with respect to the source), and an FET having a drain withstand voltage of 35 V or greater is used as the NFET M11. However, in the first embodiment, a high voltage is applied to the power supply terminal Tp of the latch circuit 18. A withstand voltage of a typical MOSFET is about 5 V, and when a voltage of 5 V or higher is applied to the power supply terminal Tp, the latch circuit 18 is broken. The fourth embodiment is an example in which breakage of the latch circuit 18 can be inhibited even when the voltage of the voltage Vin becomes high.

Figure 16:
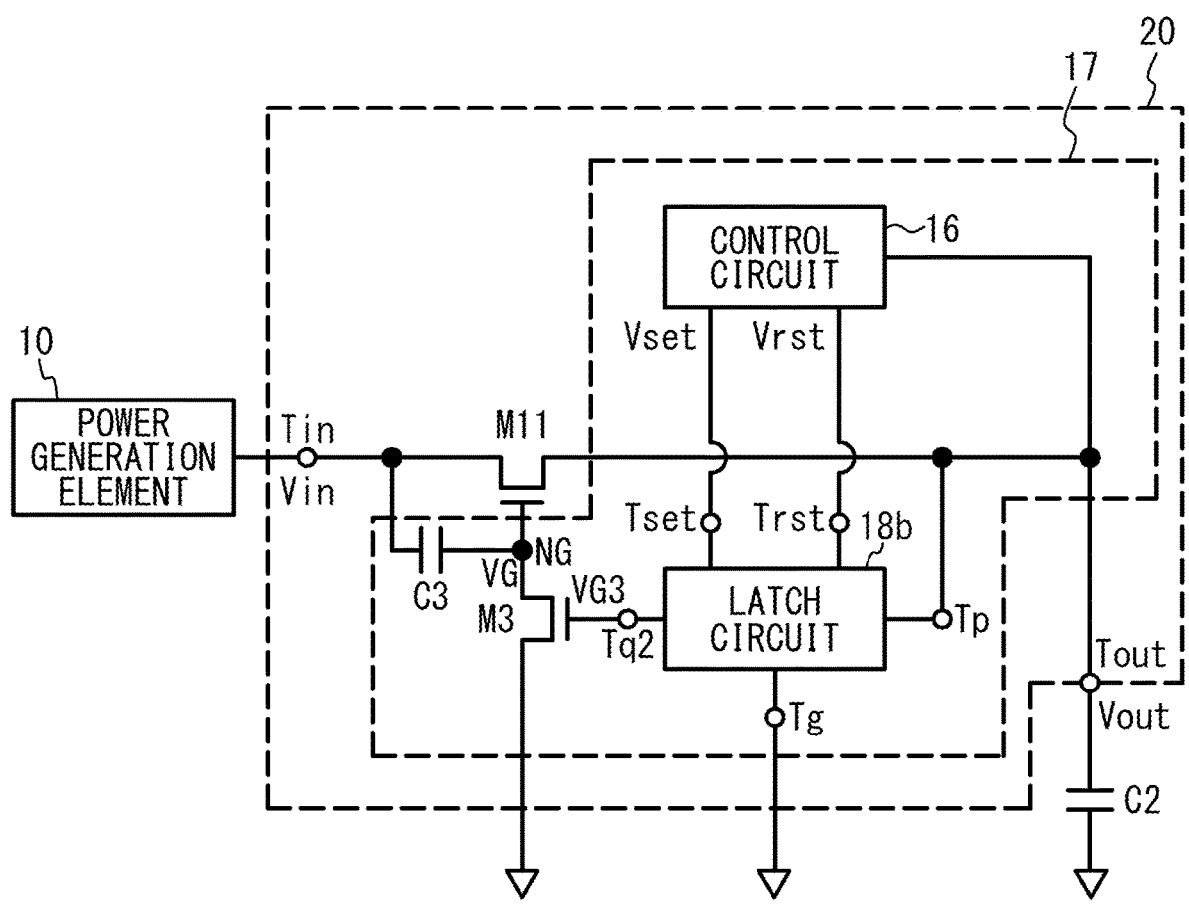
FIG. 16 is a circuit diagram of a switching circuit in accordance with a fourth embodiment.

FIG. 16 is a circuit diagram of a switching circuit in accordance with the fourth embodiment. As illustrated in FIG. 16, the gate of the NFET M11 is connected to a node NG. A capacitor C3 is connected between the node NG and the input terminal Tin. The NFET M11 and the capacitor C3 are high withstand voltage elements, and the withstand voltage is, for example, equal to or higher than 35 V. The source and the drain of the NFET M3 are connected to a ground and the node NG, respectively. The NFET M3 is an enhancement type FET. The power supply terminal Tp of a latch circuit 18b is connected to the output terminal Tout. The reference potential terminal Tg is connected to a ground. The output terminal Tq2 is connected to the gate of the NFET M3. The voltages Vset and Vrst are input from the control circuit 16 to the set terminal Tset and the reset terminal Trst of the latch circuit 18b, respectively.

In FIG. 7, from time t11 to time t14 and from time t17 to time t18, the voltage VG3 applied to the gate of the NFET M3 is 0 V, and from time t14 to time t17, the voltage VG3 is Vout. If the capacitance of the capacitor C3 is made sufficiently large with respect to the gate capacitance of the NFET M11 and the drain capacitance of the NFET M3, when the voltage Vin increases after time t11, the voltage VG at the gate of the NFET M11 capacitively coupled to the input terminal Tin increases as substantially the same voltage as the voltage Vin. When the voltage VG3 becomes Vout and the NFET M3 is turned on at time t14, the voltage VG becomes 0 V and the NFET M11 is turned off. When the voltage VG3 becomes 0 V and the NFET M3 is turned off at time t17, the voltage VG becomes substantially Vin and the NFET M11 is turned on. Other operations of the switching circuit 20 are the same as those in FIG. 7 of the first embodiment, and the description thereof will be omitted.

In the fourth embodiment, the NFET M3 (third switching element) controls the connection state between the node NG and the reference potential in accordance with the voltage VG3 applied to the gate (third control terminal). The latch circuit 18b continues to output the reference potential to the gate of the NFET M3 until the voltage difference Vout−0 V between both ends of the capacitor C2 reaches the reference voltage Vref1, and when the voltage difference Vout−0 V exceeds the reference voltage Vref1, outputs Vout to the gate of the NFET M3 until the voltage difference Vout−0 V becomes lower than the reference voltage Vref2. As described above, since the power supply terminal Tp of the latch circuit 18b is connected to the output terminal Tout, the latch circuit 18b can be prevented from being broken even when the voltage Vin becomes high.

First Variation of Fourth Embodiment

In the fourth embodiment, when the input voltage Vin increases while the NFETM11 is off, a leakage current may flow through the NFET M11 and a current may flow from the input terminal Tin to the output terminal Tout. In particular, in the case that the NFET M11 is a high-withstand-voltage FET, the off-resistance may be low and the leakage current may increase. A first variation of the fourth embodiment is an example of reducing the leakage current of the NFET M11.

Figure 17:
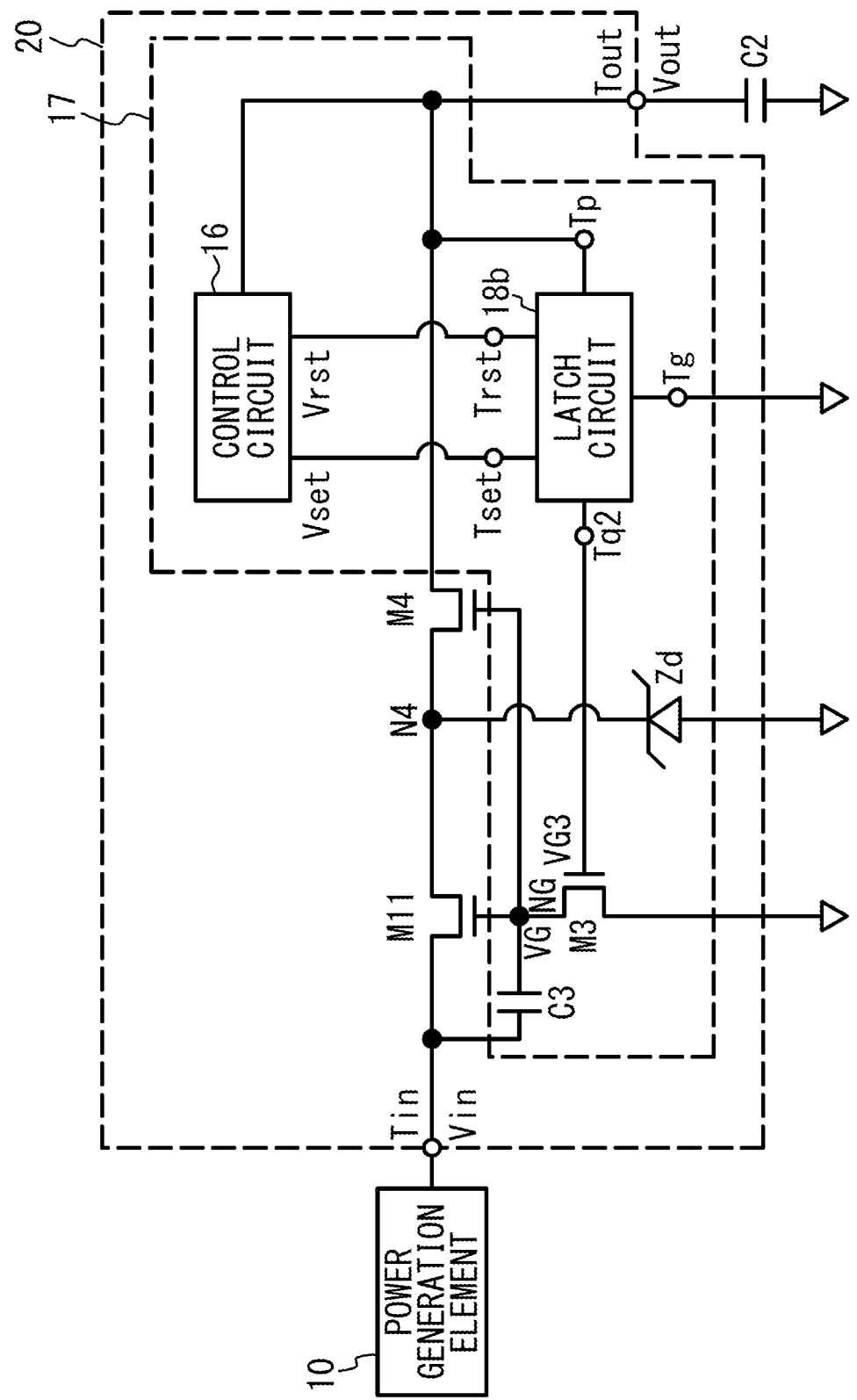
FIG. 17 is a circuit diagram of a switching circuit in accordance with a first variation of the fourth embodiment.

FIG. 17 is a circuit diagram of a switching circuit in accordance with the first variation of the fourth embodiment. As illustrated in FIG. 17, compared with FIG. 16 of the fourth embodiment, the switching circuit 20 further includes the NFET M4 and a Zenner diode Zd. The source of the NFET M4 is connected to the output terminal Tout, the drain is connected to the source of the NFET M11, and the gate is connected to the node NG. The NFET M4 is an enhancement type FET, and the threshold voltage of the NFET M4 is substantially the same as that of the NFET M11. By using an FET with a drain withstand voltage lower than that of the NFET M4 instead of a high-withstand-voltage FET for the NFET M4, the off-resistance of the NFET M4 can be higher than that of the NFET M11. The anode of the Zener diode Zd is connected to a ground, and the cathode thereof is connected to a node N4 between the NFETs M11 and M4. The breakdown voltage of the Zener diode Zd is, for example, 5.5 V. Other circuit configurations are the same as that of FIG. 16 of the fourth embodiment, and the description thereof is omitted.

In FIG. 7, the PFET M2 is turned on and off when the NFET M11 is on and off, respectively. Since the NFETs M11 and M4 are connected in series between the input terminal Tin and the output terminal Tout, it is possible to reduce a leakage current flowing from the input terminal Tin to the output terminal Tout when the NFETs M11 and M4 are off. However, when the off-resistance of the NFET M4 is high, the voltage of the node N4 becomes high. When the voltage at the node N4 with respect to the output voltage Vout exceeds the drain withstand voltage of the NFET M4, the NFET M4 may be broken down. Therefore, the breakdown voltage of the Zener diode Zd is set to be equal to or less than (the drain withstand voltage of the NFET M4−the maximum value of Vout). This configuration inhibits the voltage of the node N4−Vout from becoming higher than the drain withstand voltage of the NFET M4. Therefore, the NFET M4 can be inhibited from being broken down.

In the first variation of the fourth embodiment, the NFET M4 (fourth switching element) has a drain withstand voltage lower than that of the NFET M11, and controls the connection state between the NFET M11 and the output terminal Tout in accordance with the voltage applied to the node NG. The Zener diode Zd (limiting element) limits the voltage at the node N4 so that it does not exceed a breakdown voltage (third predetermined value). Thus, provision of the NFET M4 can reduce the leakage current flowing from the input terminal Tin to the output terminal Tout. Provision of the Zener diode Zd inhibits the NFET M4 from being broken because of a high voltage applied to the NFET M4.

The input voltage Vin applied to the NFET M11 can be prevented from becoming high by providing the Zener diode Zd closer to the input terminal Tin than the NFET M11. However, when the cold start switch CSW is off, the output power of the power generation unit 10a may be rectified in a rectifier circuit (for example, a rectifier circuit 62 illustrated in FIG. 18 described later) different from the rectifier circuit 10b illustrated in FIG. 1. In this case, if the voltage Vin of the input terminal Tin is limited, a high voltage is not applied to the different rectifier circuit. Therefore, the Zener diode Zd is preferably provided in the node N4 as in the first variation of the fourth embodiment.

In the fourth embodiment and the first variation thereof, an example has been described in which enhancement type NFETs are used as the NFETs M11 and M4 in the case that the input voltage Vin is higher than the ground potential, but enhancement type PFETs are used instead of the NFETs M11 and M4 in the case that the input voltage Vin is lower than the ground potential.

In the first to fourth embodiments and the variations thereof, when the transistor is of an enhancement type, the NFETs M11, M11b, M3, and M4 are off when the gate voltage is the ground potential 0 V, and are turned on when the gate voltage becomes higher than the positive threshold voltage. The PFETs M11a, M11c, and M2 are off when the gate voltage (the voltage of the gate with respect to the source) is the ground potential 0 V, and are turned on when the gate voltage becomes lower than the negative threshold voltage. The NFETs M11, M11b, M3, M4 and the PFETs M11a, M11c and M2 are MOS (Metal Oxide Semiconductor) FETs using silicon, for example.

The switching circuits of the first to fourth embodiments and the variations thereof are used as the cold start switch CSW of the voltage conversion circuit 12 of FIG. 1. When the reset voltage Vrst is output, the voltage conversion circuit 12 (power conversion circuit) starts conversion of the output power of the power generation element 10. In other words, the circuit 17 activates the voltage conversion circuit 12 when outputting the reset voltage Vrst. Although FIG. 1 illustrates an example of a step-down/step-up voltage conversion circuit as a power supply circuit, the power supply circuit may be a step-down voltage conversion circuit, a step-up voltage conversion circuit, or an inverting voltage conversion circuit. The power conversion circuit may be a voltage conversion circuit (for example, a direct current (DC)-DC converter) that includes an inductor and converts a third voltage (for example, a DC voltage) input from the power generation element 10 into a fourth voltage (for example, a DC voltage). The power supply circuit may be a power conversion circuit or the like that converts alternating current to direct current.

Figure 18:
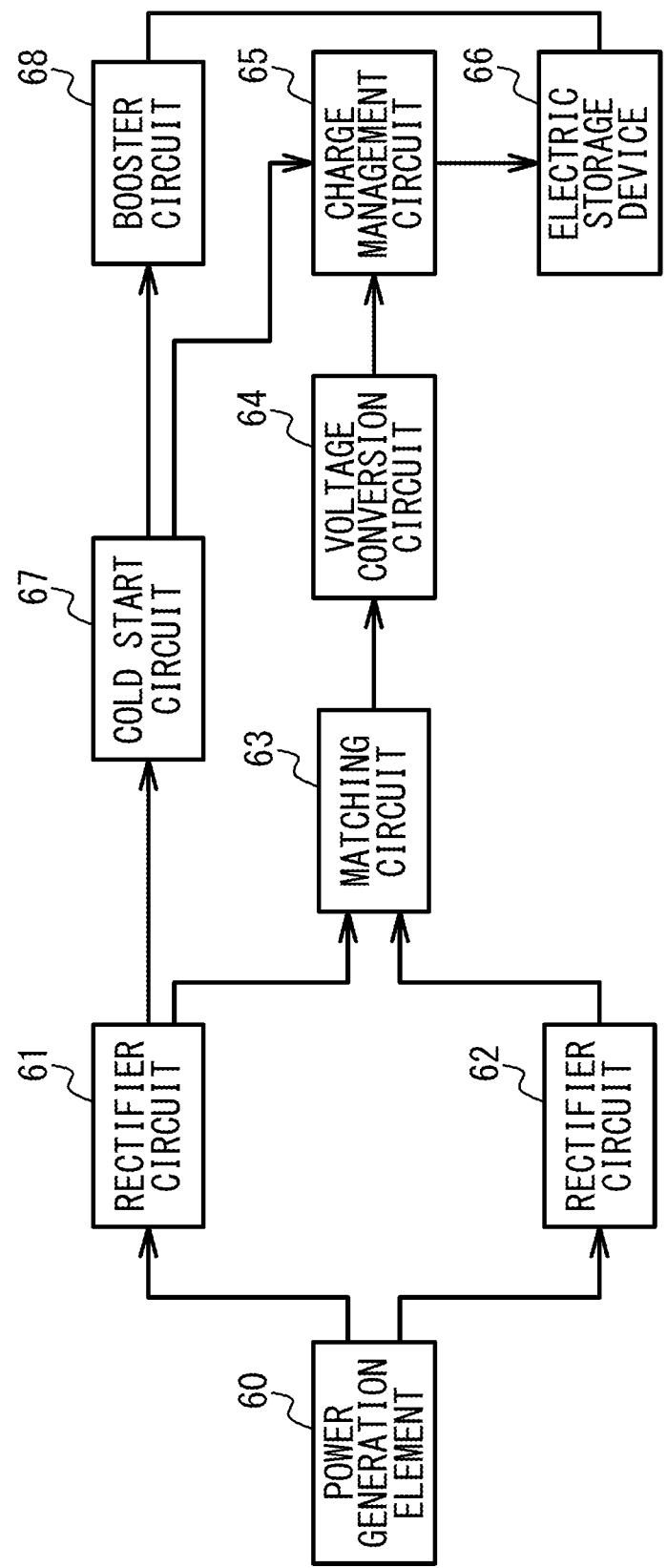
FIG. 18 is a block diagram illustrating a system in which the switching circuit according to the first to fourth embodiments and their variations is used.

FIG. 18 is a block diagram illustrating a system in which the switching circuit according to any one of the first to fourth embodiments and their variations are used. As illustrated in FIG. 18, the system includes a power generation element 60, rectifier circuits 61 and 62, a matching circuit 63, a voltage conversion circuit 64, a charge management circuit 65, an electric storage device 66, a cold start circuit 67, and a booster circuit 68.

The power generation element 60 is, for example, the power generation element 10 of FIG. 1, and generates alternating-current power of a micro current. The rectifier circuit 61 is, for example, a diode bridge, and the rectifier circuit 62 is, for example, a synchronous rectifier circuit. The matching circuit 63 matches the output impedance of the rectifier circuits 61 and 62 with the input impedance of the voltage conversion circuit 64. The voltage conversion circuit 64 is, for example, the voltage conversion circuit 12 of FIG. 1, and is a DC-DC converter. The charge management circuit 65 charges an appropriate one of a plurality of the electric storage devices 66. The electric storage device 66 is, for example, a capacitor. The charge management circuit 65 monitors the voltages at both ends of a plurality of the electric storage devices and appropriately charges the electric storage devices with the generated power. The cold start circuit 67 is the switching circuit 20 illustrated in any one of the first to fourth embodiments and the variations thereof, and charges the electric storage device 66 with the output current of the rectifier circuit 61 when the electric storage device 66 is little charged. The booster circuit 68 is, for example, a charge pump, and generates a voltage used for the rectifier circuit 62, the voltage conversion circuit 64, and the like.

The operation of the system will now be described. When the power generation element 60 generates micro power in a state where the electric storage device 66 is little charged, the rectifier circuit 61 rectifies the micro power. The rectifier circuit 61 is preferably a circuit that can perform rectification without an external power supply, such as a diode bridge. The rectifier circuit is not limited to a diode bridge, and may be a rectifier circuit formed by combining FETs in which a gate and a source or a drain are short-circuited. A rectifier circuit configured by combining such FETs is suitable for generating micro power in that a voltage drop can be reduced as compared with a diode bridge. The current rectified by the rectifier circuit 61 reaches the charge management circuit 65 via the cold start circuit 67 and is stored in the electric storage device 66. When the electric storage device 66 is charged to a sufficient voltage, the booster circuit 68 boosts the voltage of the electric storage device 66 to a voltage used by the rectifier circuit 62 and the voltage conversion circuit 64. The voltage of the electric storage device 66 is, for example, 1 V, and the voltage output from the booster circuit 68 is, for example, 2 V. When the rectifier circuit 62 and the voltage conversion circuit 64 operate using the voltage of the electric storage device 66, the booster circuit 68 may be omitted.

The matching circuit 63 changes the input voltages of the rectifier circuits 61 and 62 according to the amount of power generated by the power generation element 60. A value obtained by dividing the input voltage by the output current of the power generation element 60 is the input impedance of the rectifier circuits 61 and 62. Therefore, the matching circuit 63 increases the input voltage when the output current of the power generation element 60 is large, and decreases the input voltage when the output current of the power generation element 60 is small. Thus, the output impedance of the power generation element 60 is matched with the input impedance of the rectifier circuits 61 and 62. The matching circuit 63 switches between the rectifier circuits 61 and 62 according to the input voltage. For example, in the case that the rectifier circuits 61 and 62 are a diode bridge and a synchronous rectifier circuit, respectively, when the input voltage becomes equal to or lower than 1 V, the loss due to the on-voltage of the diode becomes large. Therefore, the rectifier circuit 62 is used. When the input voltage is equal to or higher than 1 V, the rectifier circuit 61 is used.

The voltage conversion circuit 64 converts the input voltage set by the matching circuit 63 into a voltage with which the electric storage device 66 is charged. The voltage of the electric storage device 66 is, for example, 1 V or 3.3 V. The charge management circuit 65 monitors the voltages of the electric storage devices 66 and charges the appropriate storage device 66 with the generated power.

In a system using the power generation element 60 that generates such micro power, when power is not stored in the electric storage device 66, the cold start circuit 67 is turned on without power supply, and is turned off after power is stored in the electric storage device 66. By using the switching circuit 20 according to any one of the first to fourth embodiments and the variations thereof for the cold start circuit 67, the cold start switch can be stably controlled.

In the present embodiment described above, for example, the cold start switch CSW illustrated in FIG. 1 is used as a switching element that has a control terminal, a connection state between the power generation element and the electric storage device being controlled in accordance with the voltage applied to the control terminal in accordance with the present invention. An FET is used as such a switching element. Although the FET is preferable because of its low power consumption, the switching element of the present invention is not limited to the FET, but may be another switching element such as a bipolar transistor element or an IGBT (Insulated Gate Bipolar Transistor). In a bipolar transistor element, the first terminal and the second terminal are the emitter and the collector, and the control terminal is the base. In an IGBT, the first terminal and the second terminal are the emitter and the collector, and the control terminal is the gate.

The circuit 17 including the latch circuit 18 illustrated in FIG. 4 is used as a circuit that outputs a first voltage, which keeps the transistor on, to the control terminal until the voltage difference between both ends of the electric storage device becomes a first predetermined value, which is larger than the initial state, when the voltage difference increases with time from the initial state, and outputs a second voltage, which keeps the switching element off, to the control terminal until the voltage difference becomes smaller than a second predetermined value smaller than the first predetermined value when the voltage difference exceeds the first predetermined value. In the circuit illustrated in FIG. 4, the normal initial state of the voltage difference between the both ends of the electric storage device is zero volts, but the present invention is not limited to such zero volts. For example, the initial state is the voltage according to the charge amount and the capacitance of the electric storage device in a state in which a small amount of charge remains in the electric storage device. The present invention is not limited to this configuration, and may be configured with a circuit that does not include a latch circuit and has hysteresis characteristics. For example, a combination of an element in which the output voltage has hysteresis characteristics with respect to the input voltage and a control circuit that controls ON/OFF of the switch CSW according to the output voltage of the element is also included in the present invention.

Although the preferred embodiments of the present invention have been described in detail above, the present invention is not limited to the specific embodiments, and various modifications and changes can be made within the scope of the gist of the present invention described in the claims.

What is claimed is:

1. A switching circuit comprising:
 a first switching element that controls a connection state between a power generation element and an electric storage device in accordance with a voltage applied to a first control terminal; and
 a control circuit configured to output a first voltage to the first control terminal until a voltage difference between both ends of the electric storage device becomes a first predetermined value larger than an initial state when the voltage difference increases from the initial state with time, and output a second voltage to the first control terminal until the voltage difference becomes lower than a second predetermined value smaller than the first predetermined value when the voltage difference exceeds the first predetermined value, the first voltage being a voltage that keeps the first switching element on, the second voltage being a voltage that keeps the first switching element off.

2. The switching circuit according to claim 1, wherein the power generation element includes: a power generation unit configured to output an alternating current; and a rectifier circuit configured to rectify the alternating current.

3. The switching circuit according to claim 2,
 wherein the electric storage device has one end connected to a reference potential, and another end of which a connection state with the power generation element is controlled by the first switching element, and
 wherein the first switching element is an enhancement type FET, and the control circuit outputs a voltage of a terminal, which is at a side of the power generation element, of the first switching element as the first voltage, and outputs the reference potential as the second voltage.

4. The switching circuit according to claim 3,
 wherein the rectifier circuit generates a positive voltage with respect to the reference potential, and
 wherein the first switching element is an enhancement type NFET.

5. The switching circuit according to claim 3,
 wherein the rectifier circuit generates a negative voltage with respect to the reference potential, and
 wherein the first switching element is an enhancement type PFET.

6. The switching circuit according to claim 2,
 wherein the electric storage device has one end connected to a reference potential, and another end of which a connection state with the power generation element is controlled by the first switching element, and
 wherein the first switching element is an enhancement type FET, and the control circuit outputs the reference potential as the first voltage, and outputs a voltage of a terminal, which is at a side of the power generation element, of the first switching element as the second voltage.

7. The switching circuit according to claim 6,
 wherein the rectifier circuit generates a positive voltage with respect to the reference potential, and
 wherein the first switching element is an enhancement type PFET.

8. The switching circuit according to claim 6,
 wherein the rectifier circuit generates a negative voltage with respect to the reference potential, and
 wherein the first switching element is an enhancement type NFET.

9. The switching circuit according to claim 6, further comprising:
a second switching element that is an enhancement type FET and controls a connection state between the first switching element and the electric storage device in accordance with a voltage applied to a second control terminal,
wherein the control circuit outputs the reference potential to the second control terminal until the voltage difference between both ends of the electric storage device becomes the first predetermined value when the voltage difference increases with time from the initial state, and outputs a voltage of a terminal, which is at a side of the electric storage device, of the second switching element to the second control terminal until the voltage difference becomes lower than the second predetermined value when the voltage difference exceeds the first predetermined value.

10. The switching circuit according to claim 6, further comprising:
a third switching element that controls a connection state between the first control terminal and a reference potential in accordance with a voltage applied to a third control terminal,
wherein the electric storage device has one end connected to the reference potential, and another end of which a connection state with the power generation element is controlled by the first switching element,
wherein the first control terminal is capacitively coupled to the power generation element,
wherein the first switching element is an enhancement type FET, and
wherein the control circuit continues to output the reference potential to the third control terminal until the voltage difference reaches the first predetermined value, and outputs the voltage of said another end of the electric storage device to the third control terminal until the voltage difference becomes lower than the second predetermined value when the voltage difference exceeds the first predetermined value.

11. The switching circuit according to claim 10, further comprising:
a fourth switching element having a withstand voltage lower than that of the first switching element, the fourth switching element controlling a connection state between the first switching element and the electric storage device in accordance with the voltage applied to the first control terminal; and
a limiting element configured to limit a voltage between the first switching element and the fourth switching element so as not to exceed a third predetermined value.

12. The switching circuit according to claim 1, wherein the control circuit includes a latch circuit configured to output the first voltage to the first control terminal until the voltage difference between both ends of the electric storage device becomes the first predetermined value when the voltage difference increases with time from the initial state, and output the second voltage to the first control terminal until the voltage difference becomes lower than the second predetermined value when the voltage difference exceeds the first predetermined value.

13. The switching circuit according to claim 12, wherein the control circuit is a control circuit that resets a latch state of the latch circuit to output the first voltage that turns on the first switching element to a control terminal of the first switching element when the voltage difference becomes lower than the second predetermined value.

14. The switching circuit according to claim 1, wherein in the initial state, the voltage difference between both ends of the electric storage device is 0 V.

15. A power supply circuit comprising:
the switching circuit according to claim 1; and
a power conversion circuit configured to convert output power of the power generation element,
wherein the switching circuit outputs a signal for activating the power conversion circuit to the power conversion circuit when the voltage difference exceeds the first predetermined value.

16. The power supply circuit according to claim 15, wherein when the voltage difference exceeds the first predetermined value, the switching circuit remains off until the voltage difference becomes lower than the second predetermined value.

17. The power supply circuit according to claim 15, wherein when the voltage difference exceeds the first predetermined value, the switching circuit is turned off and outputs a signal for activating the power conversion circuit to the power conversion circuit.

18. The power supply circuit according to claim 15, wherein the power conversion circuit is a voltage conversion circuit that includes an inductor and converts a third voltage input from the power generation element into a fourth voltage.

19. The power supply circuit according to claim 15, wherein the switching circuit includes: a determination circuit configured to determine whether the voltage difference exceeds the first predetermined value; and a generation circuit configured to generate the signal for activating the power conversion circuit when the determination circuit determines that the voltage difference exceeds the first predetermined value.

* * * * *